United States Patent
Furukawa et al.

(10) Patent No.: US 6,344,416 B1
(45) Date of Patent: Feb. 5, 2002

(54) DELIBERATE SEMICONDUCTOR FILM VARIATION TO COMPENSATE FOR RADIAL PROCESSING DIFFERENCES, DETERMINE OPTIMAL DEVICE CHARACTERISTICS, OR PRODUCE SMALL PRODUCTIONS

(75) Inventors: Toshiharu Furukawa, Essex Junction; Mark C. Hakey, Fairfax; Steven J. Holmes, Milton; David V. Horak, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/523,480

(22) Filed: Mar. 10, 2000

(51) Int. Cl.$^7$ .............................................. H01L 21/311
(52) U.S. Cl. ........................... 438/694; 438/4; 438/759; 438/911
(58) Field of Search ................................. 438/694, 697, 438/699, 4, 713, 759, 911, 959

(56) References Cited

U.S. PATENT DOCUMENTS

| | | | |
|---|---|---|---|
| 4,788,082 A | 11/1988 | Schmitt ................... 427/248.1 |
| 4,905,075 A * | 2/1990 | Temple et al. ................. 357/74 |
| 5,356,672 A | 10/1994 | Schmitt, III et al. ......... 427/446 |
| 5,356,673 A | 10/1994 | Schmitt et al. ............. 427/446 |
| 5,534,314 A | 7/1996 | Wadley et al. .............. 427/585 |
| 5,571,322 A | 11/1996 | Halpern ..................... 118/723 |
| 5,650,197 A | 7/1997 | Halpern ................... 427/248.1 |
| 5,686,734 A * | 11/1997 | Hamakawa et al. ........... 257/16 |
| 5,759,634 A | 6/1998 | Zang ............................ 427/446 |
| 5,764,820 A * | 6/1998 | De Dobbelaere et al. ..... 385/14 |
| RE35,872 E * | 8/1998 | Fenner et al. ............. 250/336.2 |
| 5,789,124 A * | 8/1998 | Todd ............................ 430/30 |
| 5,792,707 A * | 8/1998 | Chung ........................ 438/633 |
| 5,862,147 A * | 1/1999 | Terauchi .................... 371/21.1 |
| 6,293,139 B1 * | 11/1999 | Keller et al. .................. 73/105 |
| 6,077,785 A * | 6/2000 | Andreas ..................... 438/692 |
| 6,091,254 A * | 7/2000 | Wood et al. ................. 324/758 |
| 6,127,070 A * | 10/2000 | Yang et al. ..................... 430/5 |

FOREIGN PATENT DOCUMENTS

| | | | | |
|---|---|---|---|---|
| JP | 02-237678 A | * | 9/1990 | ........... H01L/21/02 |
| JP | 09-260277 A | * | 10/1997 | ........... H01L/21/27 |

OTHER PUBLICATIONS

Zhang, et al., "Jet Vapor Deposition: A New, Low Cost Metallization Process", 1997 International Symposium on Microelectronics.

* cited by examiner

Primary Examiner—Matthew Smith
Assistant Examiner—Renzo N. Rocchegiani
(74) Attorney, Agent, or Firm—Schmeiser, Olsen and Watts

(57) ABSTRACT

Methods and apparatuses are disclosed that can introduce deliberate semiconductor film variation during semiconductor manufacturing to compensate for radial processing differences, to determine optimal device characteristics, or produce small production runs. The present invention radially varies the thickness and/or composition of a semiconductor film to compensate for a known radial variation in the semiconductor film that is caused by performing a subsequent semiconductor processing step on the semiconductor film.

Additionally, methods and apparatuses are disclosed that can introduce deliberate semiconductor film variations to determine optimal device characteristics or produce small production runs. Introducing semiconductor film variations, such as thickness variations and/or composition variations, allow different devices to be made. A number of devices may be made having variations in semiconductor film. Because the semiconductor film has variations between the devices, device characteristics of the devices should be different. By measuring the device characteristics of devices having the variations, the device with the optimum device characteristic may be chosen, thereby indicating the appropriate semiconductor film thickness and/or composition. Moreover, small production runs of the same devices, having different characteristics, will allow the end user to select the appropriate devices for their needs.

14 Claims, 21 Drawing Sheets

DELIBERATE SEMICONDUCTOR FILM VARIATION TO COMPENSATE FOR RADIAL PROCESSING DIFFERENCES, DETERMINE OPTIMAL DEVICE CHARACTERISTICS, OR PRODUCE SMALL PRODUCTIONS

BACKGROUND OF THE INVENTION

1. Technical Field

The present invention relates generally to the field of semiconductor manufacturing and, more specifically, to deliberate semiconductor film variation during semiconductor manufacturing to compensate for radial processing differences, determine optimal device characteristics, or produce small production runs.

2. Background Art

Some semiconductor processing steps create radial differences across the wafer. For example, when performing Chemical-Mechanical Polishing (CMP) of the surface of a semiconductor wafer, the portion of the semiconductor wafer towards the outer circumference of wafer will be ground more than the inner portion of the semiconductor wafer. Similarly, during a Reactive Ion Etch (RIE) of the gate stack, the gates formed at the outer periphery of the semiconductor wafer will be etched more then the gates formed near the center of the semiconductor wafer. Consequently, the gates at the outer periphery of the semiconductor wafer will have a smaller width than the gates at the center of the semiconductor wafer. Both of these radial processing effects will cause radial differences in device characteristics between devices formed at the center of the wafer and devices formed near the outer periphery of the wafer.

Additionally, as the semiconductor industry progresses towards very large wafer sizes, there will be more waste during the small batches that are used to determine optimal device characteristics. For example, with large wafer sizes, a small company may only need to order enough chips to fill 20 to 50 wafers. To determine optimal device characteristics, several runs through the process will usually be performed with a few wafers. Each of these wafers will have something modified—such as gate width or composition of the gate dielectric—that is expected to change one or more device characteristics. Each of devices on the wafers are compared to determine which of the devices have the optimal device characteristics for the current application. However, these few wafers and the processing time and steps performed to complete them can be relatively expensive.

Moreover, as the semiconductor industry converts to large wafer sizes, small batches of specialty chips, especially those made for a small chip designer, can become relatively expensive. During production runs for a small chip designer, it is usually unclear what device characteristics are appropriate for the designer's chips. Consequently, several wafers will be run through the production line, with each wafer producing devices having different characteristics. The small chip designer can then choose the best chips to be packaged. Unfortunately, this process generates excessive waste, is therefore costly, and takes quite a bit of time.

Therefore, without a way to reduce or eliminate radial processing effects, to determine optimal device characteristics, or to produce small batches of varied semiconductor devices, semiconductor devices built near the center of the semiconductor wafer will have different characteristics than devices built near the periphery of the wafer, and there will be higher cost and more waste when performing prototyping to determine optimal device characteristics and to produce small batches of chips.

DISCLOSURE OF INVENTION

Accordingly, the present invention provides methods and apparatuses that can introduce deliberate semiconductor film variation during semiconductor manufacturing to compensate for radial processing differences, to determine optimal device characteristics, or produce small production runs. One of the embodiments of the present invention radially varies the thickness and/or composition of a semiconductor film to compensate for a known radial variation in the semiconductor film that is caused by performing a subsequent semiconductor processing step on the semiconductor film.

The advantage of this embodiment of the current invention is that the effects of the subsequent semiconductor processing step on the semiconductor film will be reduced. This creates more consistent devices over the entire surface of wafer. Moreover, because of the consistency of the devices, the devices towards the inner portion of the wafer will have the same electrical characteristics as the devices towards the outer portion of the wafer. This allows designers the freedom to design tighter electrical tolerances of the devices.

Additionally, the present invention provides methods and apparatuses that can introduce deliberate semiconductor film variations to determine optimal device characteristics or to produce small production runs of devices. Introducing semiconductor film variations, such as thickness variations and/or composition variations, allow different devices to be made on the same wafer. Variations in the semiconductor film cause variations between the devices. By measuring the device characteristics of devices having the variations, the device with the optimum device characteristic may be chosen.

This embodiment of the present invention has the advantage that one or a few semiconductor wafers may be used to produce many devices having different device characteristics. Many different device characteristics may be introduced. This allows the optimal device to be selected among these different devices. Because so few semiconductor wafers may be used to determine the optimal device, fewer semiconductor wafers and passes through processing systems will be used.

Moreover, when producing batches of chips for a small chip designer, low volume Application Specific Integrated Circuit (ASIC) chips may be produced more cost-effectively by reducing the number of wafers required to yield the desired amount of product. Each wafer can have multiple chips, with each row of chips having devices with different characteristics. This limits the amount of extraneous production runs to produce the appropriate chip having the required characteristics.

The foregoing and other advantages and features of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE(S) FOR CARRYING OUT THE INVENTION

Figure 1:
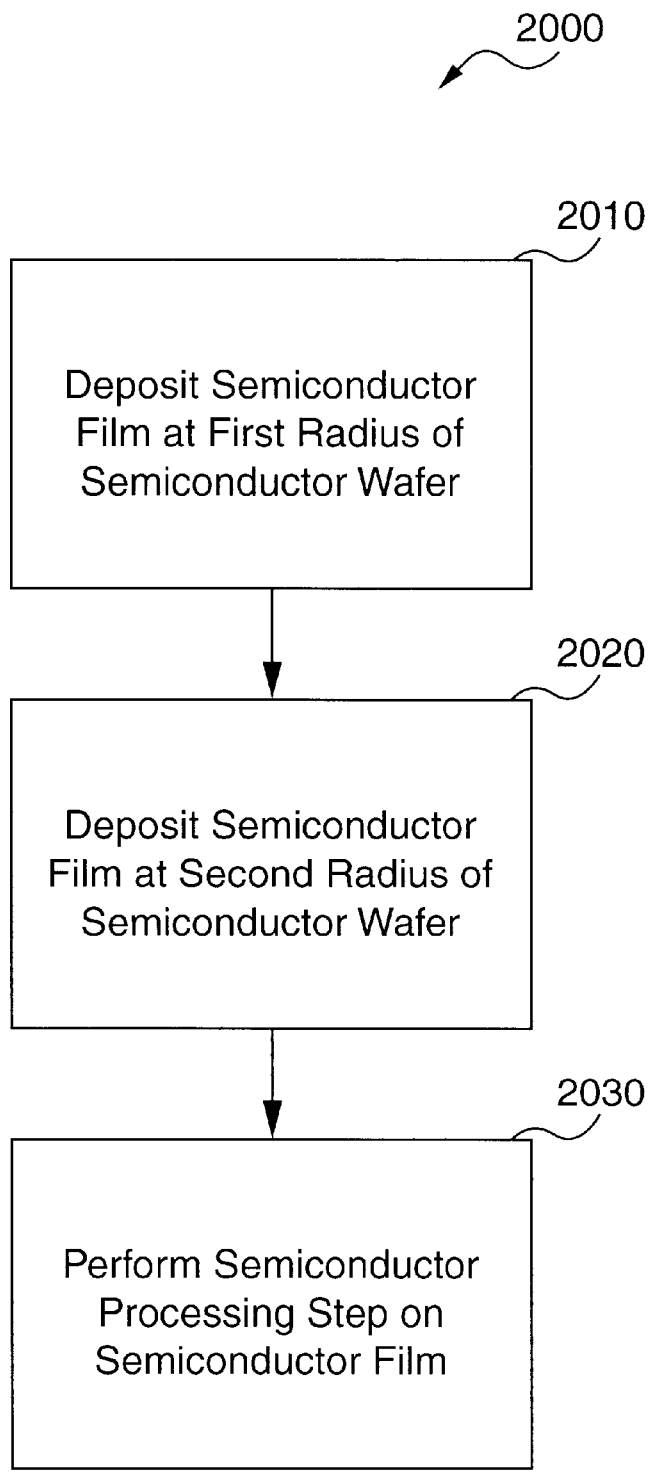
FIG. 1 is a preferred method for reducing the radial effects of the semiconductor processing step in accordance with a preferred embodiment of the present invention.

The preferred embodiments of the present invention overcome the limitations of the prior art and provide methods and apparatuses that can introduce deliberate semiconductor film variation during semiconductor manufacturing to compensate for radial processing differences or to determine optimal device characteristics. The present invention radially varies the thickness and/or composition of a semiconductor film to compensate for a known radial variation in the semiconductor film that is caused by performing a subsequent semiconductor processing step on the semiconductor film.

For example, it is known that a gate conductor stack will be etched more at the outer circumference of the semiconductor wafer than at an inner circumference of the semiconductor wafer. This causes wider gates at the inner circumference of the semiconductor wafer than at the outer circumference of the semiconductor wafer. Using the current invention, the thickness and/or composition of the gate conductor stack may be adjusted to reduce this known radial variation.

As a second example, Chemical Mechanical Polishing (CMP) generally thins the surface near an inner radius of the semiconductor wafer more than the surface near an outer radius the semiconductor wafer. Using the current invention, the thickness and/or composition of the CMP stop or other semiconductor film may be changed to reduce this known radial variation.

Additionally, the present invention provides methods and apparatuses that can introduce deliberate semiconductor film variations to determine optimal device characteristics. Introducing semiconductor film variations, such as thickness variations and/or composition variations, allow different devices to be made. A number of devices may be made having the variations in semiconductor film. Because the semiconductor film has variations between the devices, device characteristics of the devices should be different. By measuring the device characteristics of devices having the variations, the device with the optimum device characteristic may be chosen, thereby indicating the appropriate semiconductor film thickness and/or composition.

The device characteristics may be changed, for example, by changing the composition or thickness of the gate oxide, changing the composition or thickness the spacer material, or changing the composition or thickness of the gate conductor. By producing a variety of devices having a variety of device characteristics on one or a few semiconductor wafers, a higher yield, lower cost process can be attained.

The preferred mechanism for creating deliberate semiconductor film variations to compensate for radial processing differences or determine optimal device characteristics is a Jet Vapor Deposition (JVD) tool. This tool, as is known in the art, allows a vapor to be deposited on the surface of anything that is within a certain distance from the end of a nozzle. Because of the various configurations of the JVD tool, wherein the surface may be moved translationally or rotationally while the nozzle is moved translationally, the JVD tool allows a variety of compositions (including multiple materials in a composition) to be applied at any location on the semiconductor wafer. However, the JVD tool is used differently in the current invention than in the prior art. For example, in the prior art, the thickness of a semiconductor film is controlled such that the thickness is the same at all locations on semiconductor wafer. Moreover, in the prior art, the composition of the semiconductor film is kept the same over all of the semiconductor wafer. Thus, in the prior art, it is important to maintain the same thickness and composition of the semiconductor wafer over the surface of the wafer.

In the current invention, however, the thickness and/or composition of the semiconductor film is changed based on radial distance from the center of the semiconductor wafer. This embodiment allows compensating for radial processing effects. Alternatively, the semiconductor film's thickness and/or composition is changed, preferably in stripes across the wafer, to create different devices on the same wafer. This embodiment allows many different devices to be created on the same wafer, thereby providing the ability to determine optimal device characteristics and providing enhanced yield and cycle time for low-volume production ASICs.

Various embodiments of the JVD tool are described in the following, each of which is incorporated herein by reference: Zhang, et al., "Jet vapor deposition: A new, low cost metallization process", 1997 International Symposium on Microelectronics, pp. 146–149; Schmitt, "Method and apparatus for the deposition of solid films of a material from a jet stream entraining the gaseous phase of said material", U.S. Pat. No. 4,788,082; Schmitt, et al., "Method for microwave plasma assisted supersonic gas jet deposition of thin films", U.S. Pat. No. 5,356,672; Schmitt, et al., "Evaporation system and method for gas jet deposition of thin film materials", U.S. Pat. No. 5,356,673; Halpern, "Jet vapor deposition of organic molecule guest-inorganic host thin films", U.S. Pat. No. 5,650,197; Halpern, "Electron jet vapor deposition system", U.S. Pat. No. 5,571,332; and Zang, "Jet vapor deposition of nonocluster embedded thin films". Any of the proceeding JVD tools may be used with the current invention.

Turning now to FIG. 1, FIG. 1 is a block diagram of the preferred method for compensating for radial processing effects on a semiconductor wafer. Method 2000 is performed to reduce a known radial variation in a semiconductor film that is caused by performing a semiconductor processing step on the semiconductor film. Examples of known radial variations and their associated processing steps are uneven width of gates caused by the semiconductor processing step of etching, particularly Reactive Ion Etching (RIE), or uneven polishing of the semiconductor wafer's surface during the semiconductor processing step of CMP. There can be several different techniques used to reduce these known radial variations caused by the semiconductor processing steps. These are explained below.

Method 2000 begins in step 2010 when a semiconductor film is deposited at a first radius of the semiconductor wafer. Generally, this radius will be an inner radius towards the center of the semiconductor wafer, but first radius may also be an outer radius towards the edge of the semiconductor wafer. The semiconductor film will be deposited to a certain thickness. Alternatively, the semiconductor film will comprise a first composition.

In step 2020, the semiconductor film is deposited at a second radius of the semiconductor wafer. As previously discussed, this radius will usually be an outer radius towards the edge of the semiconductor wafer, but may be an inner radius. The semiconductor film at the second radius will be deposited to a particular thickness. Alternatively, the semiconductor film will comprise a second composition. It is important that the semiconductor film at the first radius and the semiconductor film at the second radius be chosen to reduce the known radial variation caused by performing the semiconductor process step.

To reduce the variation, the thicknesses of the semiconductor film at the first and second radii may be different. For example, to reduce the known radial variation of uneven width gates due to the processing step of etching, the gate conductor stack may be made thicker at an outer radius and thinner at an inner radius. Alternatively, the composition of the gate conductor stack may be changed such that the semiconductor film at the outer radius resists etching more than the semiconductor film at the inner radius. Illustratively, the composition may be changed by changing the proportion of two materials that make up the composition. For instance, the gate conductor film could be tungsten silicide ($WSi_2$). To change the properties of the tungsten silicide, the ratio of the tungsten and silicon could be varied, essentially creating a $WSi_x$ composition. Higher silicon content should provide a higher etch rate, and this composition should be used in the gate conductor stack towards the outer radius of the semiconductor wafer. At inner radii of the semiconductor wafer, lower silicon (and correspondingly higher tungsten) could be added to decrease the etch rate. Thus, the proportions of these two materials could be changed between inner radii and outer radii to reduce the radial variation of uneven width of gates due to etching.

Figure 6:
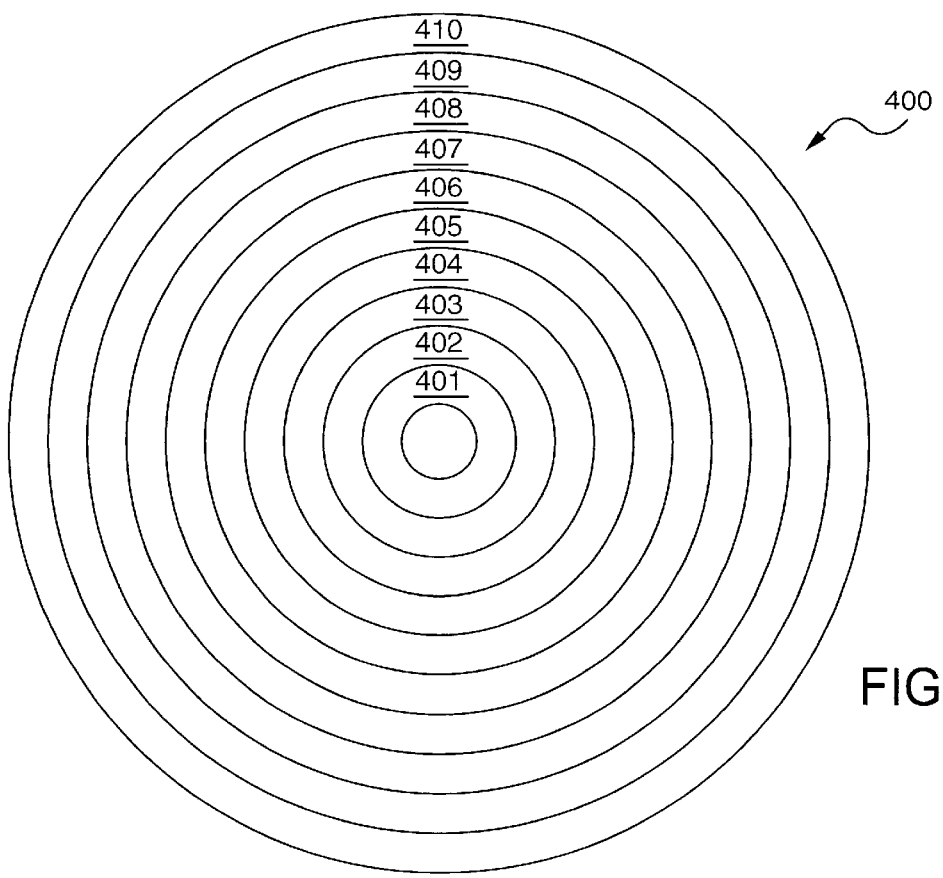
FIG. 6 is an example of patterns placed on a semiconductor wafer by the JVD tool of FIG. 5.

The JVD tool allows two or more different materials to be mixed in an almost infinite variety of proportions. As explained in reference to FIG. 5, a nozzle may be moved radially relative to a spinning semiconductor wafer, and this allows composition and/or thicknesses to be radially varied. Additionally, generally more than one nozzle may be used to provide additional materials. Turning briefly to FIG. 6 in addition to FIG. 1, in FIG. 6 semiconductor wafer 400 is shown with a plurality of locations 401 through 410. In the example of FIG. 6, location 410 will normally be kept free of semiconductor films, and the center of semiconductor wafer 400 is also clear of films. When adjusting thicknesses of a semiconductor film to reduce radial variation due to a subsequent semiconductor processing step, different thicknesses may be placed at each of the locations 401 through 409, or 401 and 402 could have the same thickness of semiconductor film while 403 and 404 will have the same thickness of semiconductor film, etc.

In step 2030, the semiconductor processing step that causes the known radial variation is performed on the semiconductor film. Because the semiconductor film has been radially adjusted, through adjusting the thickness and/or composition of the semiconductor film, there should be much less or no radial variation caused by the particular semiconductor processing step.

Thus, method 2000 of FIG. 1 compensates for a known radial variation caused by a semiconductor processing step by radially varying the thickness and/or composition of a semiconductor film.

Figure 2:
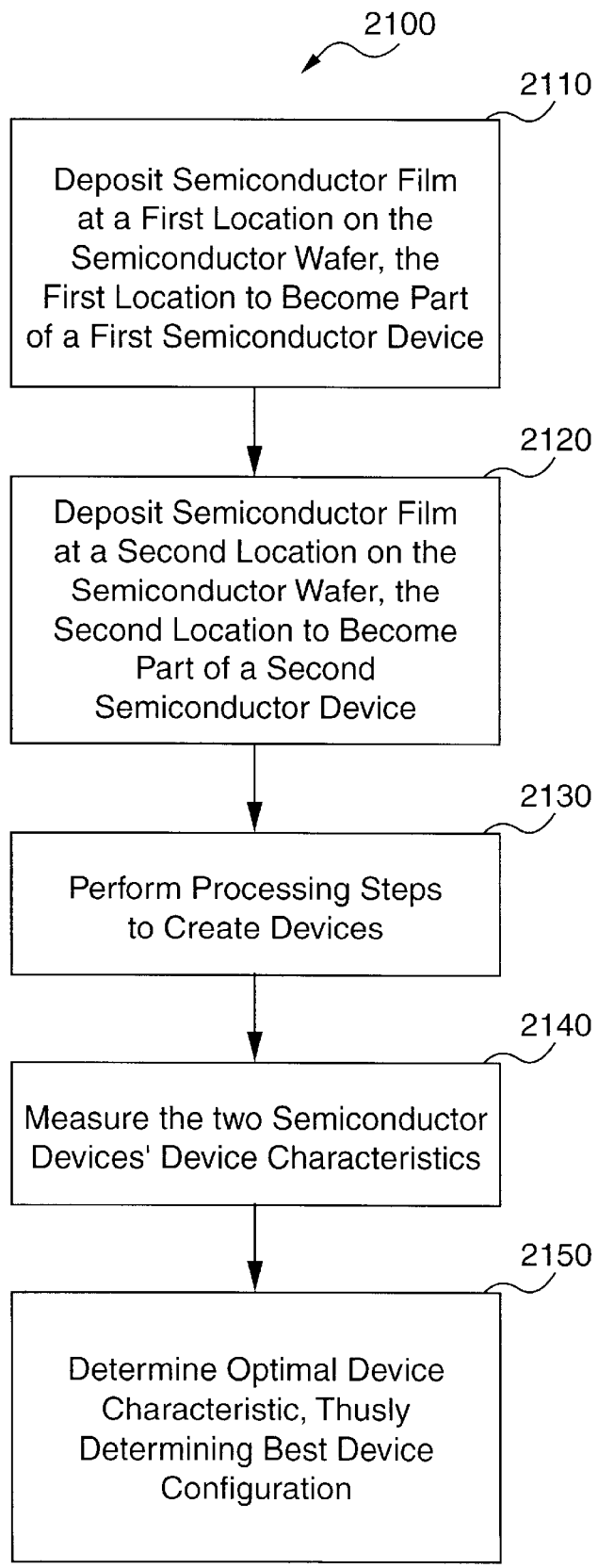
FIG. 2 is a preferred method for determining the optimal device characteristics of a semiconductor device in accordance with a preferred embodiment of the present invention.

Referring now to FIG. 2, preferred method is shown for determining optimal device characteristics and for providing low production runs. Method 2100 is used during development stages and for the production of low volume products, such as some types of ASICs, and is designed to determine optimal semiconductor film thicknesses and compositions that determine optimal device characteristics. From this range of conditions, the desired optimized chips can be selected, allowing higher yields and lower cycle times than other methods. When producing chips for low production runs, such as ASIC runs from a small designer, it is generally unclear as to what device characteristics are needed for the devices that make up the chips. Currently, several wafers are completely processed, with each wafer having different device characteristics. This allows the small designer to choose the optimum chips for its application. However, this essentially creates quite a bit of waste for small production runs.

With the current invention, different thicknesses and/or compositions of materials can be provided on the same wafer. The thicknesses and/or compositions are changed, preferably in stripes across the wafer. This provides for several different devices (and therefore the chips made of the devices) at various locations on the wafer. The small designer thus has quite a few different chips from which to choose, and yields are increased while cycle times are decreased. This is particularly true for very large wafer sizes, such as the 12 inch wafer sizes to which the semiconductor industry is transferring.

As is known in the art, semiconductor film thicknesses and compositions determine parameters of devices, which then determine device characteristics. For example, the thickness of the semiconductor film used for spacers will then determine the spacer width. For most CMOS gates, there are two different spacers. The first spacer is usually very thin (for instance, 10 nanometers). This relatively thin spacer, which is used to form diffusion extensions, defines the effective channel length, which affects the measurable device characteristic of performance (how fast the gate can respond to an input to create an appropriate output). A shorter effective channel length equates to higher current and higher performance. Thus, changing the parameter of thickness of this first spacer will change the measurable device characteristic of performance. Performance may be measured in terms of current per unit width of device, such as in current per nanometer or micrometer.

Additionally, the first spacer's thickness also affects overlap capacitance. Overlap capacitance is also related to the extent of diffusion allowed for dopant material in extensions. If the first spacer is very narrow and the diffusion occurs under the gate to a greater extent, then the overlap capacitance will be higher. A higher overlap capacitance leads to lower performance. Again, changing the parameter of thickness of this first spacer will change the measurable device characteristic of performance.

The second spacer is generally wider and deposited on the gate conductor after the first spacer. This spacer, although wider than the first spacer, should be narrow to optimize device series resistance, which will also optimize the measurable device characteristic of performance. Thinner second spacers cause less series resistance, which in turn causes higher performance. However, if this second spacer is too narrow, it will induce a "short channel effect" or a "drain induced barrier lowering effect", both of which cause sub-threshold leakage. Higher leakage causes higher offstate or standby power consumption by the device (and, thus, by the chip that is made of devices). Thus, changing the parameter of thickness of the second spacer will change the measurable device characteristics of performance and power consumption.

The gate dielectric thickness also generally affects performance. A thinner dielectric provides higher performance. If the dielectric is too thin, though, tunneling current through the gate dielectric will become significantly high (for dielectrics thinner than about 2 nanometers) to cause relatively high power consumption. Thus, changing the parameter of thickness of the gate dielectric will change the measurable device characteristics of performance and power consumption.

Gate dielectric composition also affects performance. If a dielectric with a higher dielectric constant is used, a thicker gate dielectric may be used while maintaining device performance. In this case, the thicker film may also provide less leakage (thereby providing less power consumption) by being thick enough to avoid tunneling leakage through the dielectric. Alternatively, using a different composition of gate dielectric has the benefit of allowing thinner dielectric with the same performance or power consumption. As an example, for silicon oxynitride ($SiN_xO_y$), by increasing the nitrogen (N) content, the effective dielectric thickness can be lowered. Thus, by changing the parameters of gate dielectric composition and/or thickness, one can change the measurable device characteristics of performance and power consumption.

Method 2100 generally is used for small ASIC runs of one or a few semiconductor wafers through the processing stages, when is important to tune the device characteristics of devices and when it is important to achieve the optimal device characteristics with a minimal loss of yield and cycle time. For example, when a company wishes to have a certain number of chips produced, it may not be known as to what semiconductor film thicknesses and compositions should be used to create devices meeting the company's specifications. In general, device parameters, such as effective channel length, overlap capacitance, leakage current, or series resistance, should be able to be at least partially determined from the design criteria of the devices on the chip. Such design criteria will include power, speed, or other requirements. Even though device parameters may be somewhat known through design criteria, these parameters are only "ballpark" figures and the parameters must be tuned for the particular semiconductor processing materials and processes actually being used. Method 2100 allows tuning the thicknesses and compositions of semiconductor films, and allows a variety of chips to be created on one wafer.

Method 2100 begins in step 2110 when a semiconductor film is deposited at a first location on the semiconductor wafer. The first location is to become part of a semiconductor device, after subsequent processing steps. The semiconductor film at the first location will have a particular thickness and composition. In step 2120, the semiconductor film is deposited at a second location on the semiconductor wafer. Again, the second location would become part of another semiconductor device, after subsequent processing steps. The semiconductor film at the second location will have a particular thickness and composition, which may be different than the thickness and composition of the semiconductor film at the first location.

Figure 4:
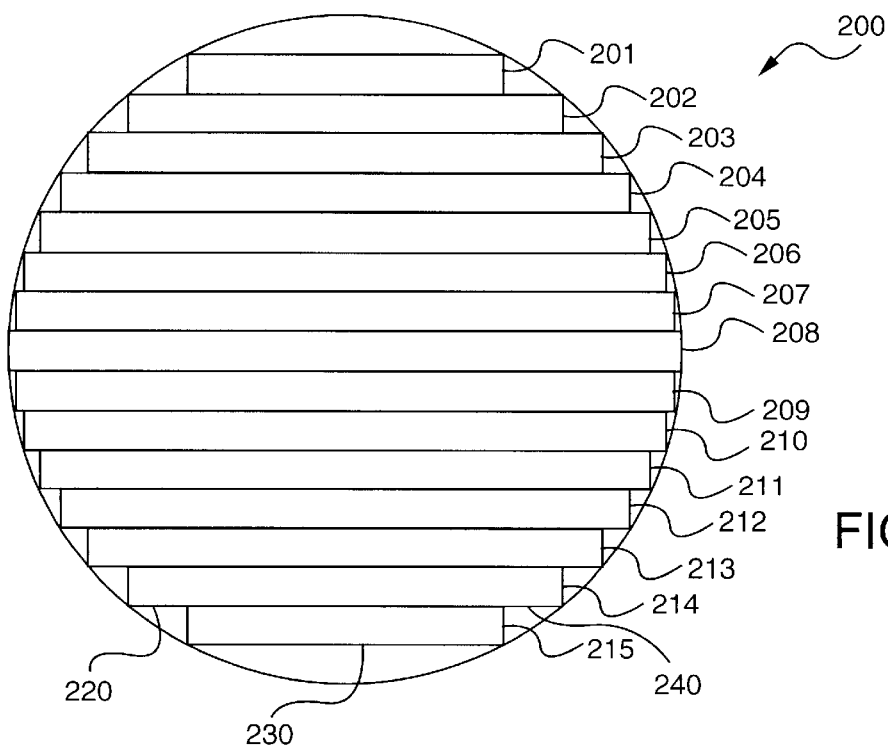
FIG. 4 is an example of patterns placed on a semiconductor wafer by the JVD tool of FIG.3.

For example, turning to FIG. 4 in addition to FIG. 2, FIG. 4 shows a semiconductor wafer 200 having a plurality of locations 201 through 215. Additionally, the semiconductor wafer has a left side 220, a middle 230, and a right side 240. When changing the thickness or composition of the semiconductor film, a different thickness or composition can be used in location 201 than is used in location 202. Moreover, different thicknesses or compositions can be used at left side 220 of location 214 than is used at either middle 230 or right side 240 of location 214. Thus, it can be seen that one single wafer can have many different devices. This allows small runs of one or a few semiconductor wafers, while providing sufficient product with optimum device characteristics, and optimizing product yield and cycle time.

In step 2130 of FIG. 2, the processing steps required to create devices are performed. As part of these processing steps, additional changes in subsequent semiconductor films' thicknesses or compositions may be made.

When producing small batches of chips, such as ASICs, for small designers, it is generally not immediately known as to what the optimum device parameters are. By creating different devices on one wafer, a variety of devices can be made on one or several wafers, particularly with large wafer sizes. This allows the end user, the small designer, to test the devices and determine which devices have the appropriate characteristics for their chips. Subsequent steps in method 2100 could be performed by the semiconductor manufacturer or by the end user.

Once the devices have been created, then two or more semiconductor devices are selected from different locations on the semiconductor wafer, with each location having a different thickness or composition of semiconductor film. Each of the device's device characteristics are determined. This occurs in step 2140. For instance, a Complementary Metal Oxide Semiconductor (CMOS) inverter's power consumption may be measured for devices at location 215 and location 203. The two power consumption measurements can be compared to determine which device has the optimal device characteristic of power consumption, based on design criteria or input from the end user. This occurs in step 2150. By measuring a number of such devices, each having different thicknesses and/or compositions of semiconductor film that affect device parameters and are expected to affect device characteristics, the optimal device characteristic may be determined. It should be noted that the optimal device characteristic is part of the design criteria, and testing of the different devices is made to determine which of the devices meets the optimal device characteristic. Once the best device is found, then the optimal thickness and/or composition of semiconductor film or films that comprise the device will be known.

It should also be noted that there could be more than one optimal device characteristic, depending on the application. For example, different combinations of thicknesses or compositions of semiconductor layers could yield similar power consumption. Furthermore, it is possible to test on a chip-by-chip basis instead of testing individual devices (inverters, AND gates, storage capacitors, etc.). For example, each chip could undergo power consumption testing at a certain speed. If the power consumption is too high, then the devices that make up the chip are not optimal.

There is a predetermined optimal device characteristic that is based on design criteria for the particular semiconductor device. The device characteristics of several of the devices are compared to see which of the devices meets or comes closest to the predetermined optimal device characteristic (step 2150). It should be noted that none of the devices may actually meet or exceed the predetermined optimal device characteristic, but one device may come closest to the predetermined optimal device characteristic. This device would be considered to meet the predetermined optimal device characteristic, as it comes closest to the optimal characteristic.

Figure 3:
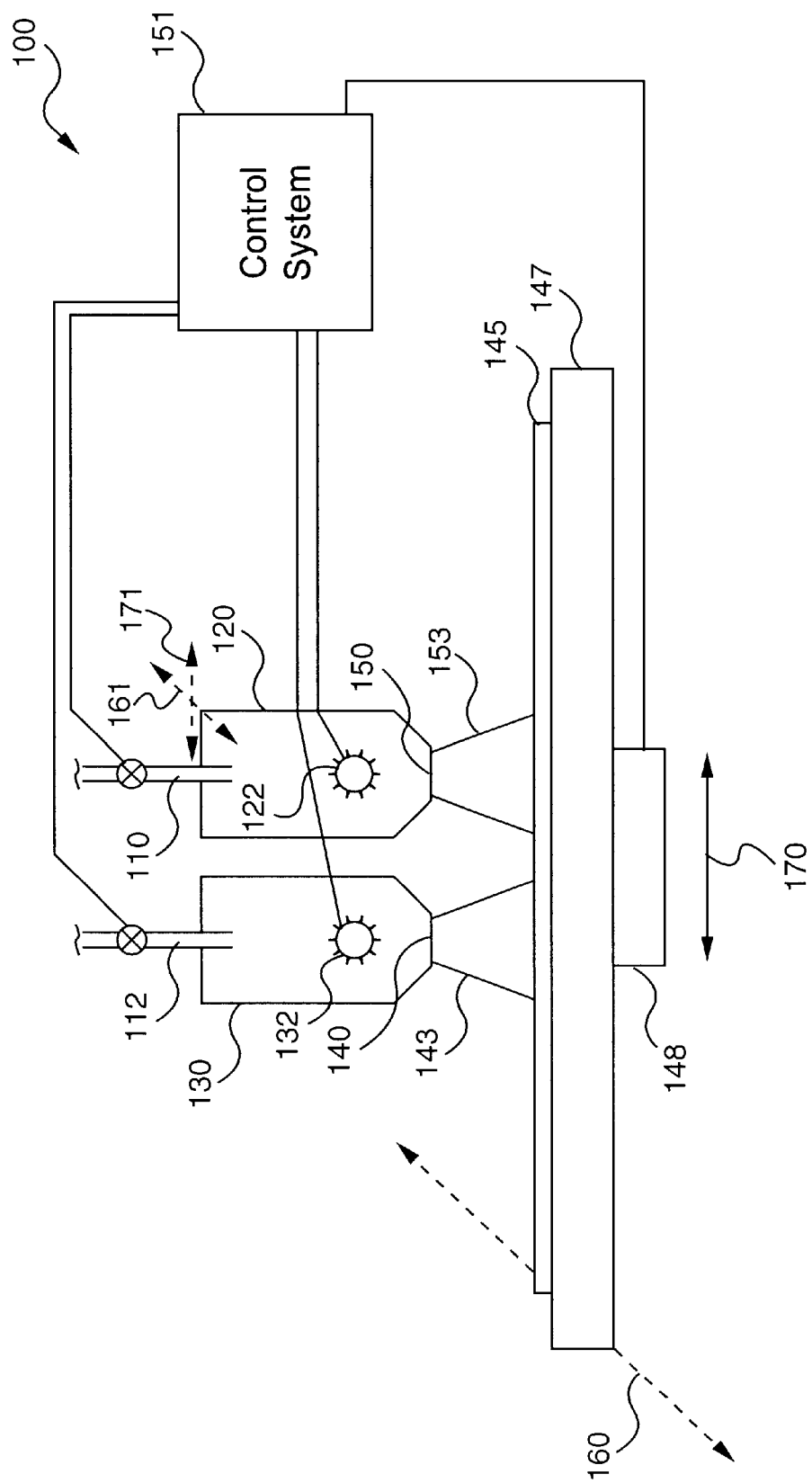
FIG. 3 is a preferred Jet Vapor Deposition (JVD) tool for determining the optimal device characteristics of the semiconductor device in accordance with a preferred embodiment of the present invention.

Turning now to FIG. 3, a Jet Vapor Deposition tool is shown for determining optimal device characteristics for devices on wafer. JVD system 100 comprises a control system 151, two nozzles 120, 130, two tubes 112, 110, a platen 147, and a platen translational moving device 148. Platen translational moving device 148 moves platen 147 along axes 170 and 160. It should also be noted that nozzles 120 and 130 may be moved along axes 161 and 171, instead of having the platen move.

Tubes 112 and 110 contain transport vapor, generally moving at a high velocity. Nozzles 120 and 130 further contain vapor sources 122 and 132 and nozzle openings 150 and 140. Vapor sources 122 and 132 emit vapor species that are entrained in the transport vapor passing through nozzles 120, 130 and are emitted as jets 143, 153. As is known, the jets then come into contact with the surface of semiconductor wafer 145 and deposit the vapor species.

Control system 151 controls the amount of vapor species emanating from vapor sources 122 and 132, the flow rate of the transport vapor through tubes 110 and 112, and the movement of platen 147 through platen translational moving device 148. By increasing the dwell time of nozzles 120, 130 over an area of the semiconductor wafer, a thicker film may be added. The "dwell time" is the time that a nozzle spends over an area when depositing a single semiconductor film, including the time spent over the area for multiple passes over the area. Nozzles 120 and 130 may be made to change the composition of the semiconductor film by gradually changing materials in the composition as the semiconductor film is deposited. A semiconductor film may also be deposited that comprises two distinct layers of materials. Finally, "grading" of the film may be accomplished by depositing a first material and then, at a demarcation point, depositing a second material, and changing the demarcation point with increasing layers of the semiconductor film. A semiconductor film, as defined herein, will be a semiconductor film that serves a particular purpose, regardless of the number of actual layers making the film. For example, gate conductors, gate conductor cap, spacers, gate dielectrics, and CMP stops are all examples of semiconductor films that serve a particular purpose. If the gate conductor comprises two separate layers, such as $WSi_x$ and polysilicon, the gate conductor film still serves to transport voltage to the gate. As another example, if the CMP stop comprises two layers of material, its purpose still is to stop the grinding of the semiconductor wafer.

Generally, dwell time will be changed by moving platen 147 slower or faster relative to nozzles 120 and 130, or vice versa. Current control systems are designed to maintain an even thickness across the semiconductor wafer, and are primarily designed to maintain an even composition across the semiconductor wafer. In the current invention, thicknesses and compositions will be changed in varying locations on the semiconductor wafer. This will require minor modifications to the current control system. Additionally, the control system will have to modify vapor sources 122 and 132 on a per-swath or even inter-swath basis.

Turning now to FIG. 4, the JVD system 100 of FIG. 3 may be used to create the swathes/locations 201 through 215 on semiconductor wafer 200. Each location 201 through 215 could have different thicknesses or compositions of a semiconductor film. These thicknesses or compositions should change parameters of devices made in one location, relative to devices made in other locations. These changes in parameters should cause corresponding changes in device characteristics. Additionally, each location/swath 210 through 215 could be graded or have different thicknesses or compositions between the left side 220, the middle 230, and the right side 240. This is particularly true for locations 207, 208, and 209 which will be longer because they are near the center of the semiconductor wafer.

With this variety of locations and the ability to change thicknesses, grading, or compositions across one of the swathes, many different semiconductor devices having different device characteristics may be made on one semiconductor wafer.

Figure 5:
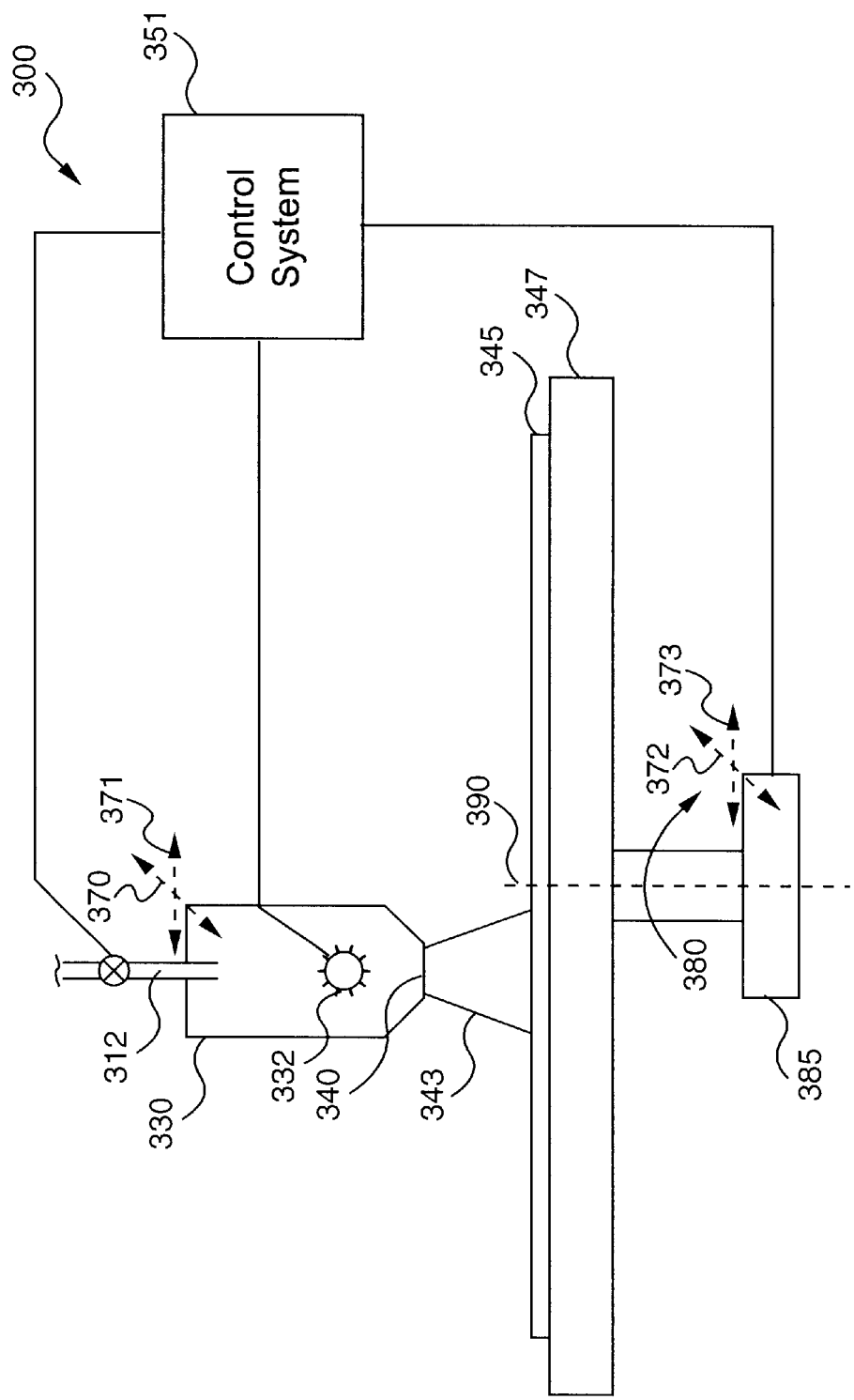
FIG. 5 is a preferred JVD tool for reducing the radial effects of the semiconductor processing step in accordance with a preferred embodiment of the present invention.

FIG. 5 shows a JVD tool 300 that can provide for rotational motion of the substrate. JVD tool 300 in this example comprises control system 351, nozzle 330, tube 312, platen 347, and rotating mechanism 385. Rotating mechanism 385 in this example is coupled to platen 347 and rotates platen 347 about axes 390 in a manner indicated by 380. Semiconductor wafer 345 is attached to platen 347. Nozzle 330 comprises a vapor source 332 and nozzle opening 340. Tube 312 contains a transport vapor, generally moving at a high velocity. Vapor source 332 emits a vapor species that is entrained in the transport vapor passing through nozzle 340 and the vapor species and transport vapor are emitted as jet 353. As is known, the jet then comes into contact with the surface of semiconductor wafer 345 and deposits the vapor species. Although only one nozzle is shown, it will be beneficial to have multiple nozzles.

The rotating mechanism 385 may be made to move in translational directions 373 and 372. In general, however, nozzle 330 will be scanned across the surface of the wafer in direction 371. Is also possible that nozzle 330 could move in direction 370. Because nozzle 330 can be scanned across the surface of the wafer and control system 351 controls the amount of vapor species in vapor source 332, JVD system 300 can create the semiconductor wafer as shown in FIG. 6. FIG. 6 shows that a variety of locations 401 through 410 may have different thicknesses and/or compositions. These different thicknesses and/or compositions are chosen to reduce the radial effects caused by a subsequent semiconductor process step. This will be discussed more particularly in reference to upcoming figures.

Figure 7:
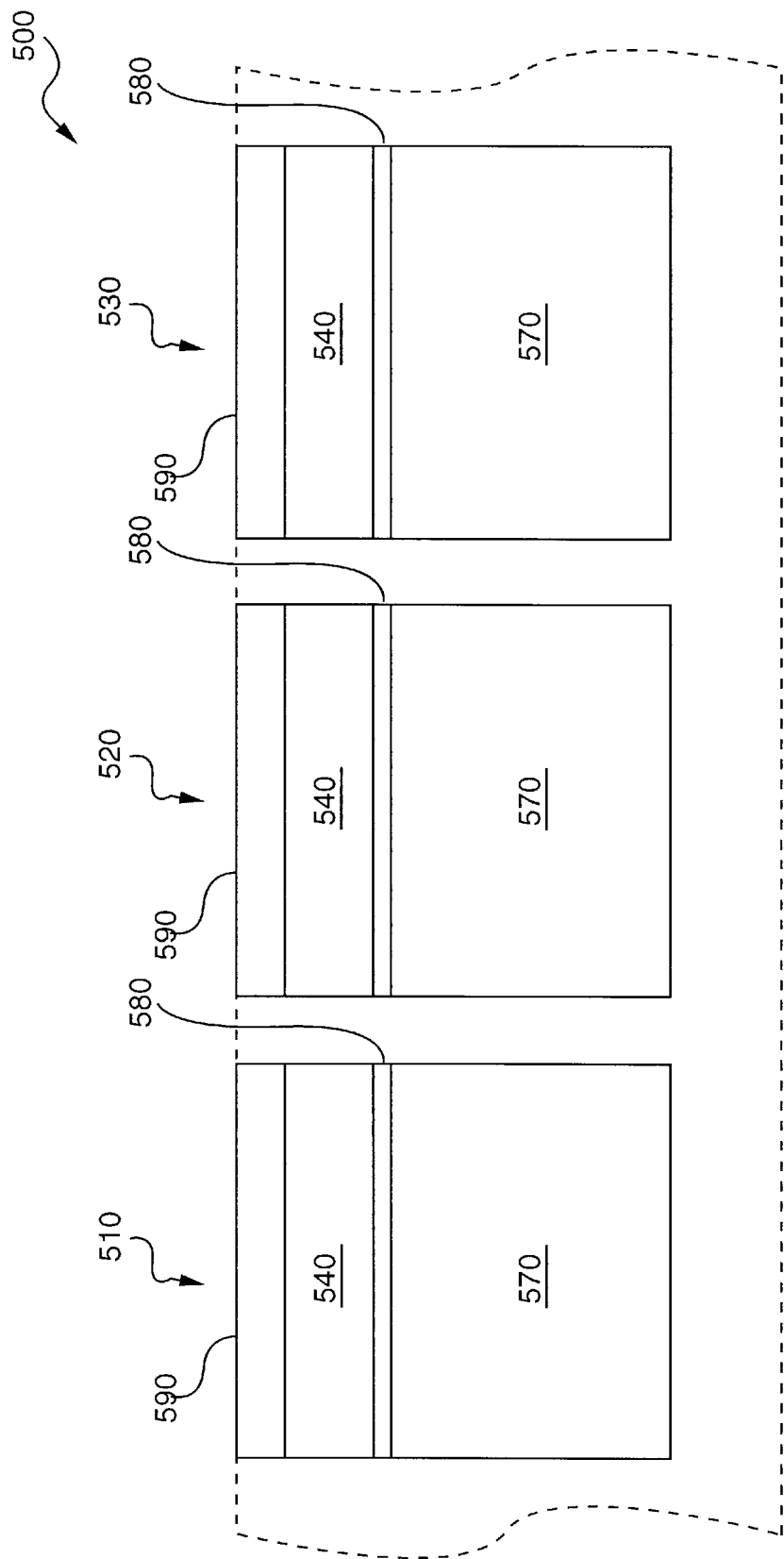
FIGS. 7 and 8 illustrate cross-sectional views of a semiconductor wafer during a prior art method wherein the gate conductor stack has uneven radial etching.

Turning now to FIG. 7, FIG. 7 shows a cross-sectional view of a semiconductor wafer 500 where a Field Effect Transistor (FET) is to be created in locations 510, 520, and 530. Location 510 in this example corresponds to location 402 of FIG. 6; location 520 corresponds to location 405 of FIG. 6; and location 530 corresponds to location 409 of FIG. 6. Thus, location 510 is closest to the center of the semiconductor wafer, location 520 is approximately midway between the center and the outer edge of the semiconductor wafer, and location 530 is near the outer edge of the semiconductor wafer.

Substrate 501 has three wells 570 into which these FET devices will be created. Each wells 570 discovered with the gate conductor stack that comprises gate conductor 540 over gate dielectric 580 and beneath gate cap 590.

Figure 8:
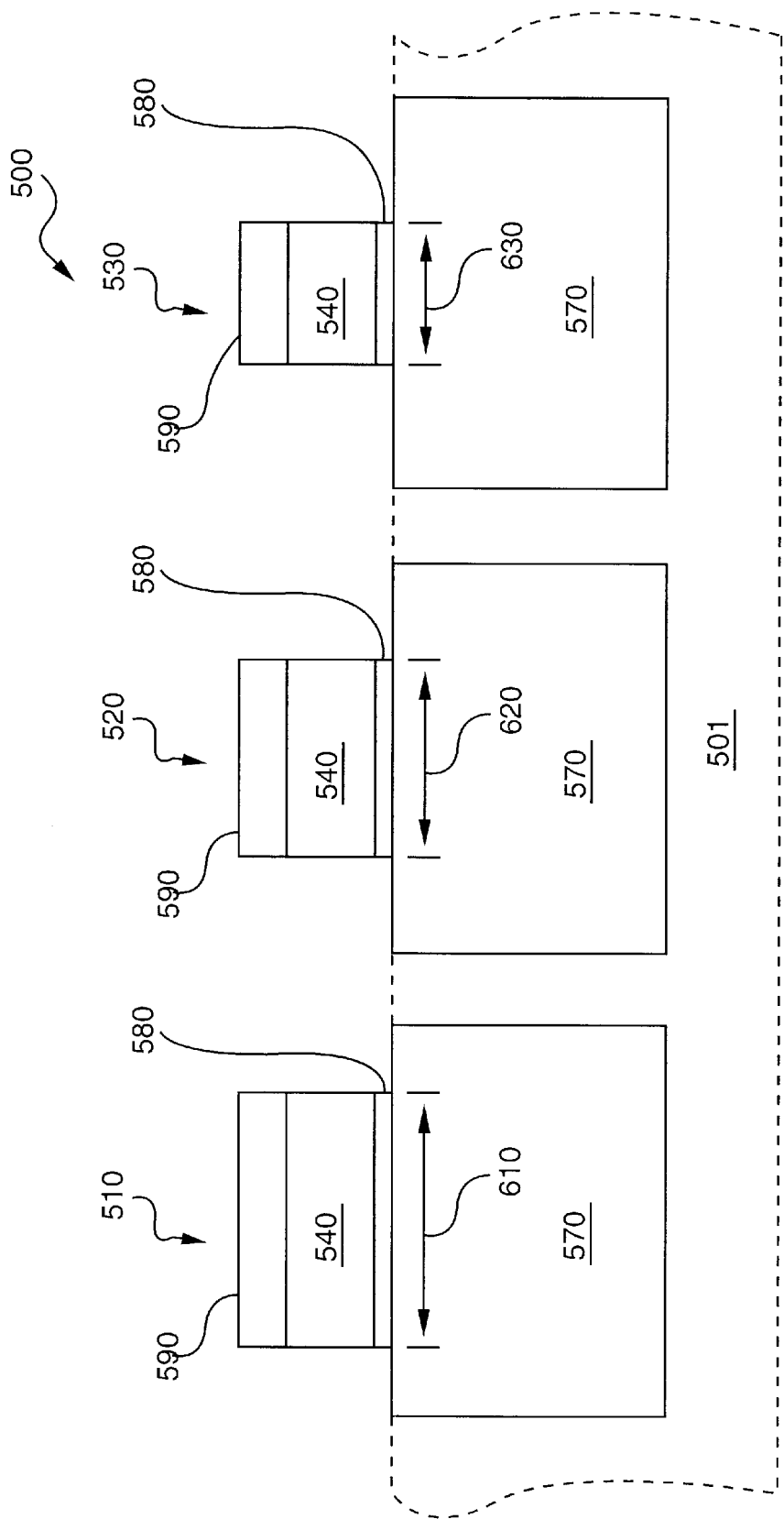

After a Reactive Ion Etch (RIE) is performed on semiconductor wafer 500, the prior art semiconductor wafer looks as it does in FIG. 8. This example shows that the gate conductor stack at location 510 is wider (having width 610) than the gate conductor stack at location 620 (having width 620), which is wider than the gate conductor stack at location 530 (having width 630). The RIE etches the gate conductor stack towards the outer circumference of the semiconductor wafer more than the gate conductor stack towards the inner circumference. This uneven radial etching is a known radial variation caused by the semiconductor processing step of RIE.

Figure 9:
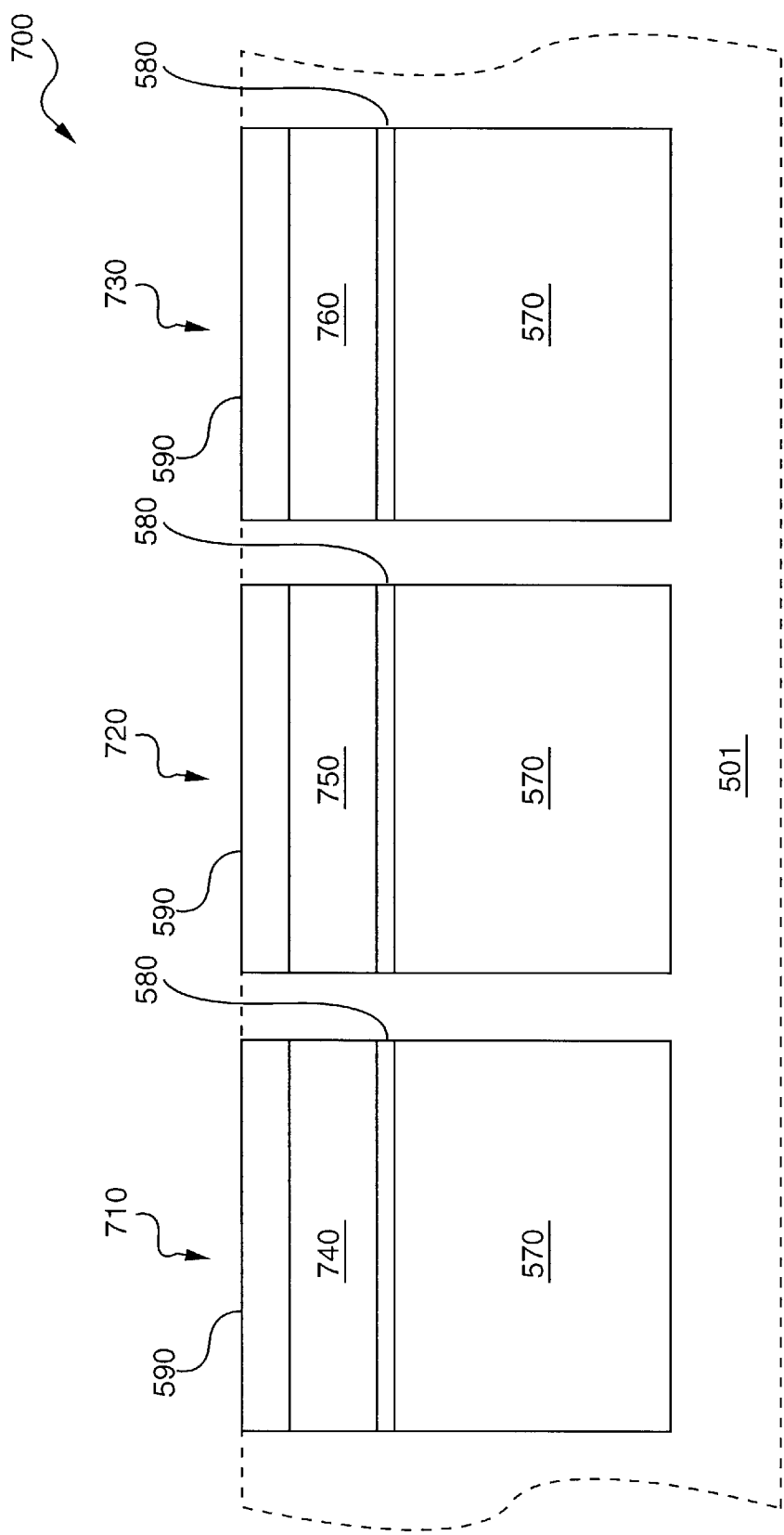
FIGS. 9, 10, and 11 illustrate cross-sectional views of a semiconductor wafer during a preferred method wherein the gate conductor stack has even radial etching due to radial adjustments made in accordance with preferred embodiments of the present invention.

Referring now to FIG. 9, a method step for compensating for the radial processing effect of uneven radial etching is shown. In this step, different gate conductor compositions are used at location 710, 720, and 730. Location 710 in this example corresponds to location 402 of FIG. 6, while location 720 corresponds to location 405 of FIG. 6, and location 730 corresponds to location 409 of FIG. 6. Illustratively, gate conductor 740, 750, and 760 is a semiconductor film having a composition of $WSi_x$, with the W and Si in different proportions at each location. At location 710, gate conductor 740 comprises a higher percentage of silicon than what the gate conductor layer has at locations 750 and 760. Correspondingly, gate conductor 760 contains a lower percentage of silicon than what the gate conductor contains at locations 750 and 760. The higher percentage of W in gate conductor 760 should reduce the radial effects of the RIE.

Figure 10:
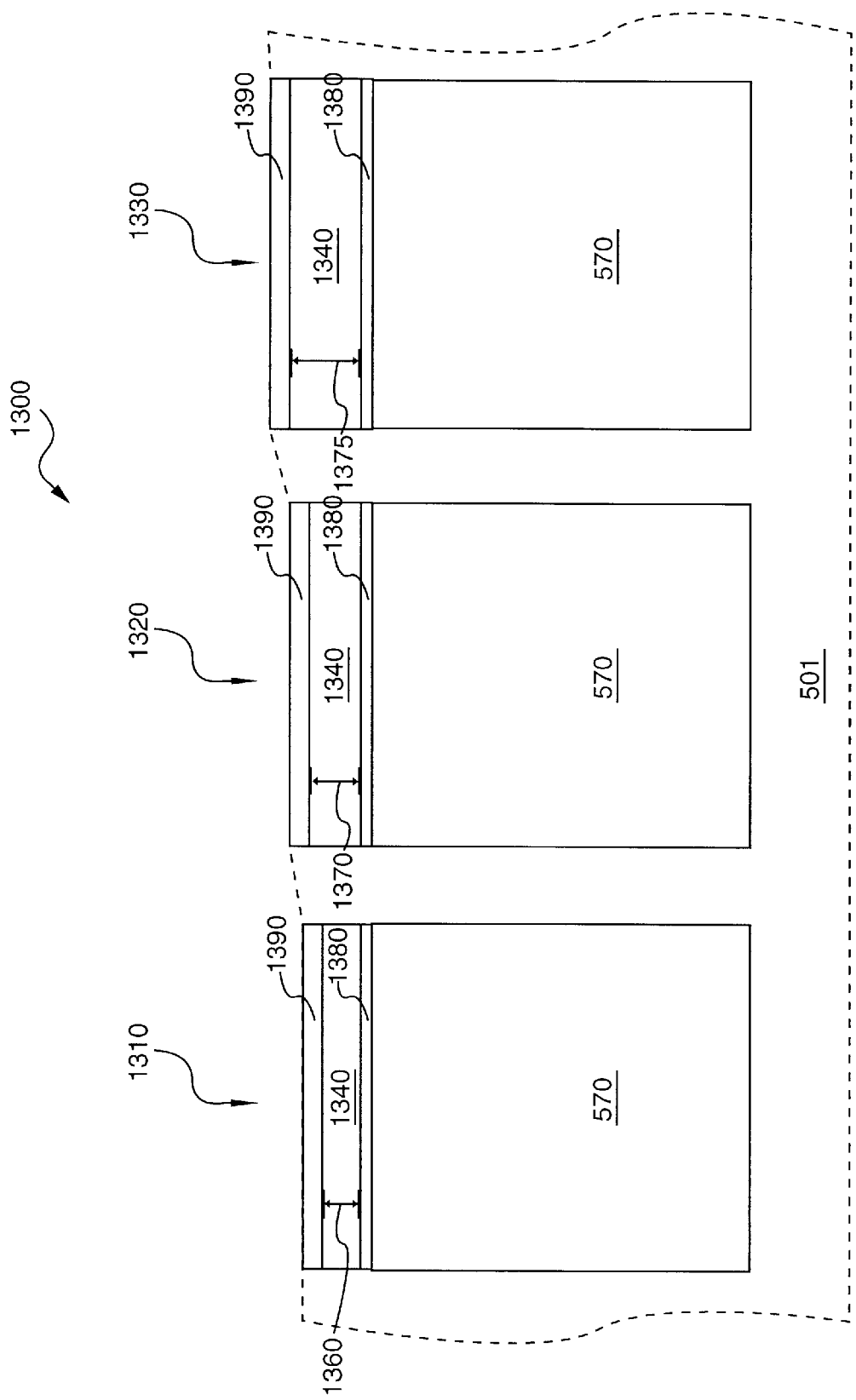

Turning now to FIG. 10, a second method step is shown that compensates for the radial processing effect of uneven radial etching. In this embodiment, the gate conductor stack at locations 1310, 1320, and 1330 has varying thicknesses. Again, location 1310 corresponds to location 402 of FIG. 6, location 1320 corresponds to location 405 of FIG. 6, and location 1330 corresponds to location 409 of FIG. 6. To create these varying thicknesses, gate conductor film 1340 has a thickness 1360 at location 1310, thickness 1370 at location 1320, and thickness 1375 at location 1330. This increasing thickness with increasing radius from the center of the semiconductor wafer should reduce the radial effects caused by etching.

Figure 11:
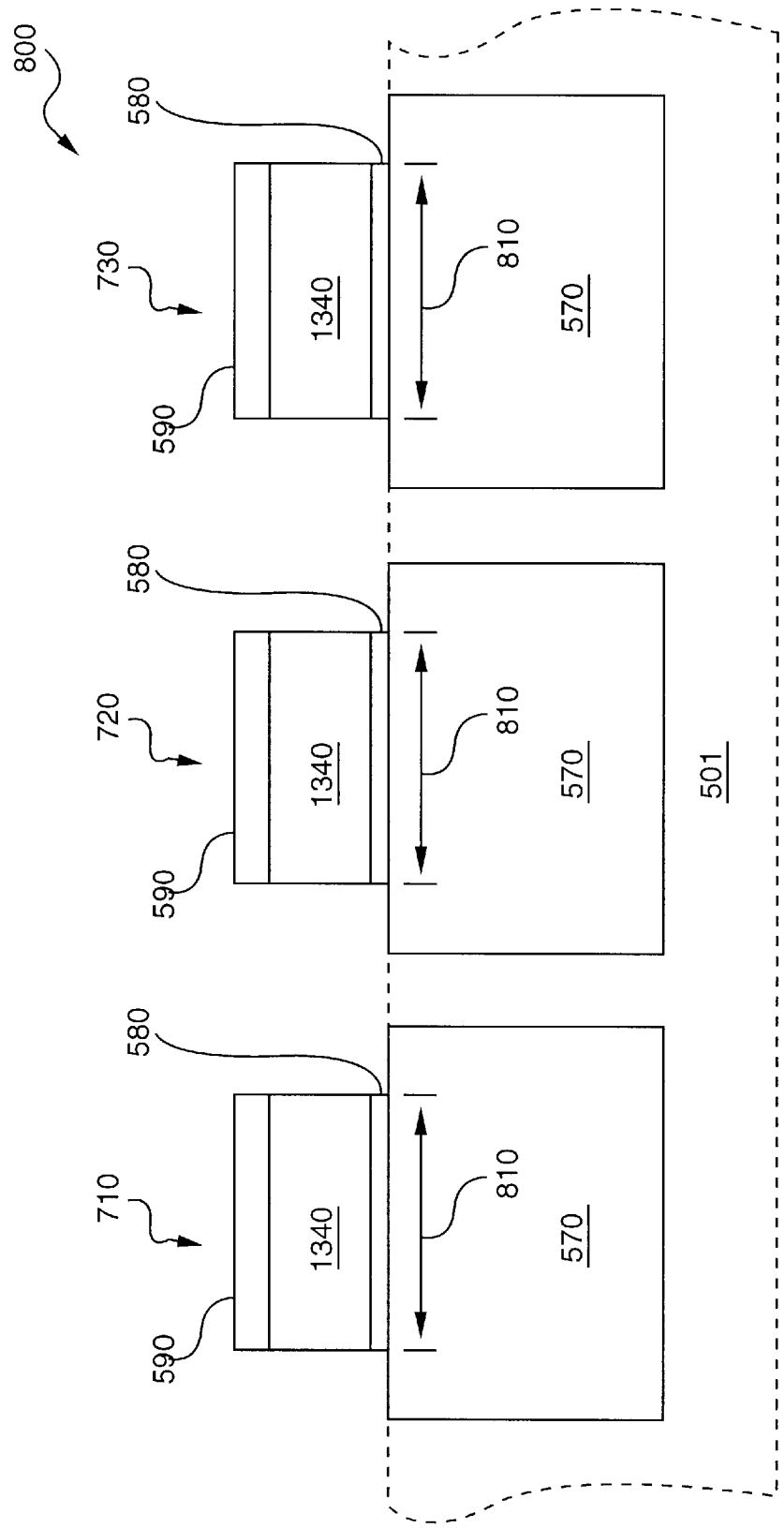

In FIG. 11, semiconductor wafer 800 is shown after etching by RIE. For both embodiments where the composition (FIG. 9) is changed and the thickness (FIG. 10) is changed with radial location, the resultant gates at locations 710 (corresponding to location 1310), 720 (corresponding to location 1320), and 730 (corresponding to location 1330) should be the same width 810. Without changing the composition or thickness of one of the gate conductor stack films, the prior art result of FIG. 8 would be reached.

Figure 12:
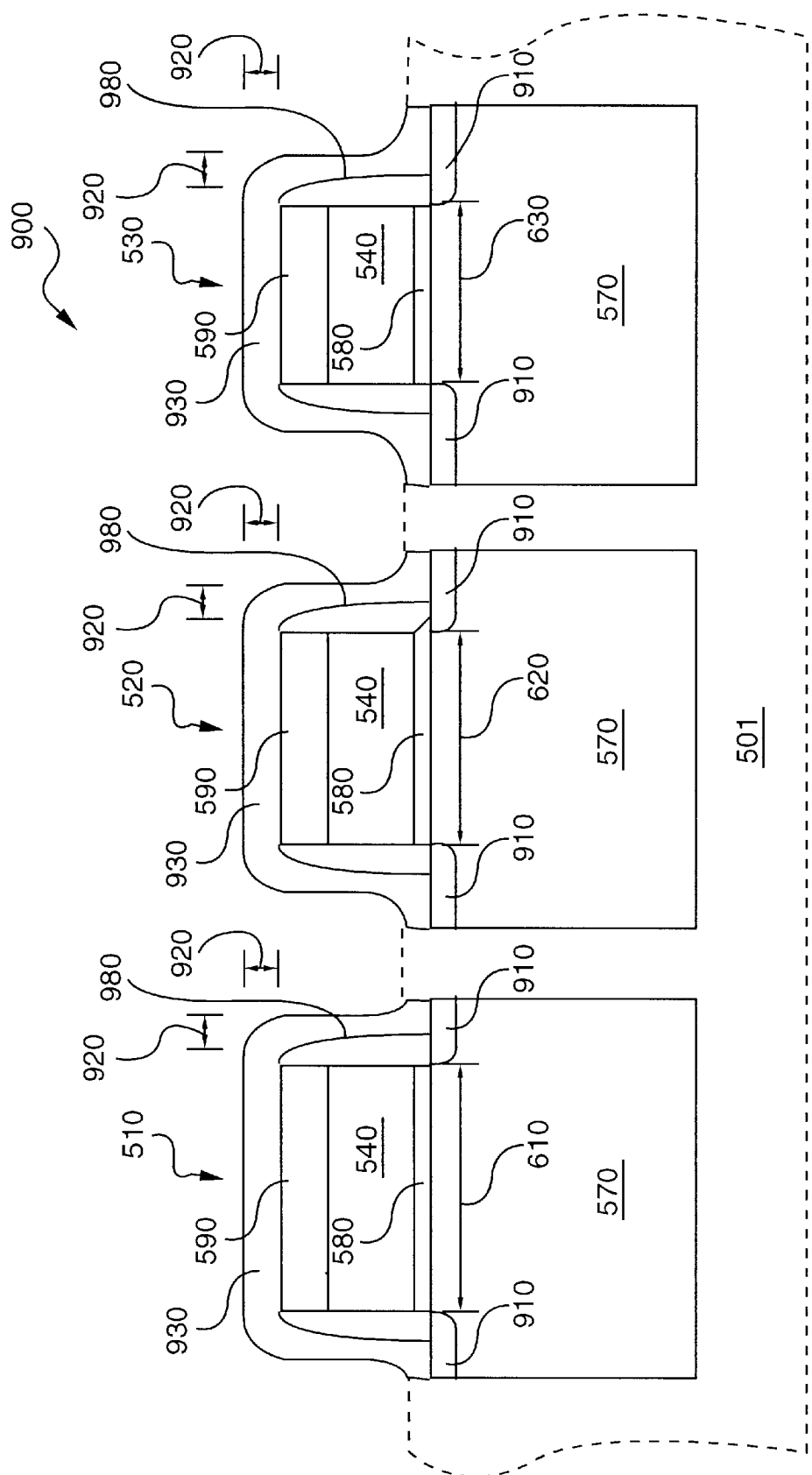
FIGS. 12 and 13 illustrate cross-sectional views of a semiconductor wafer during a prior art method wherein the gates are disproportionate because the gate conductor stack has uneven radial etching.
Figure 13:
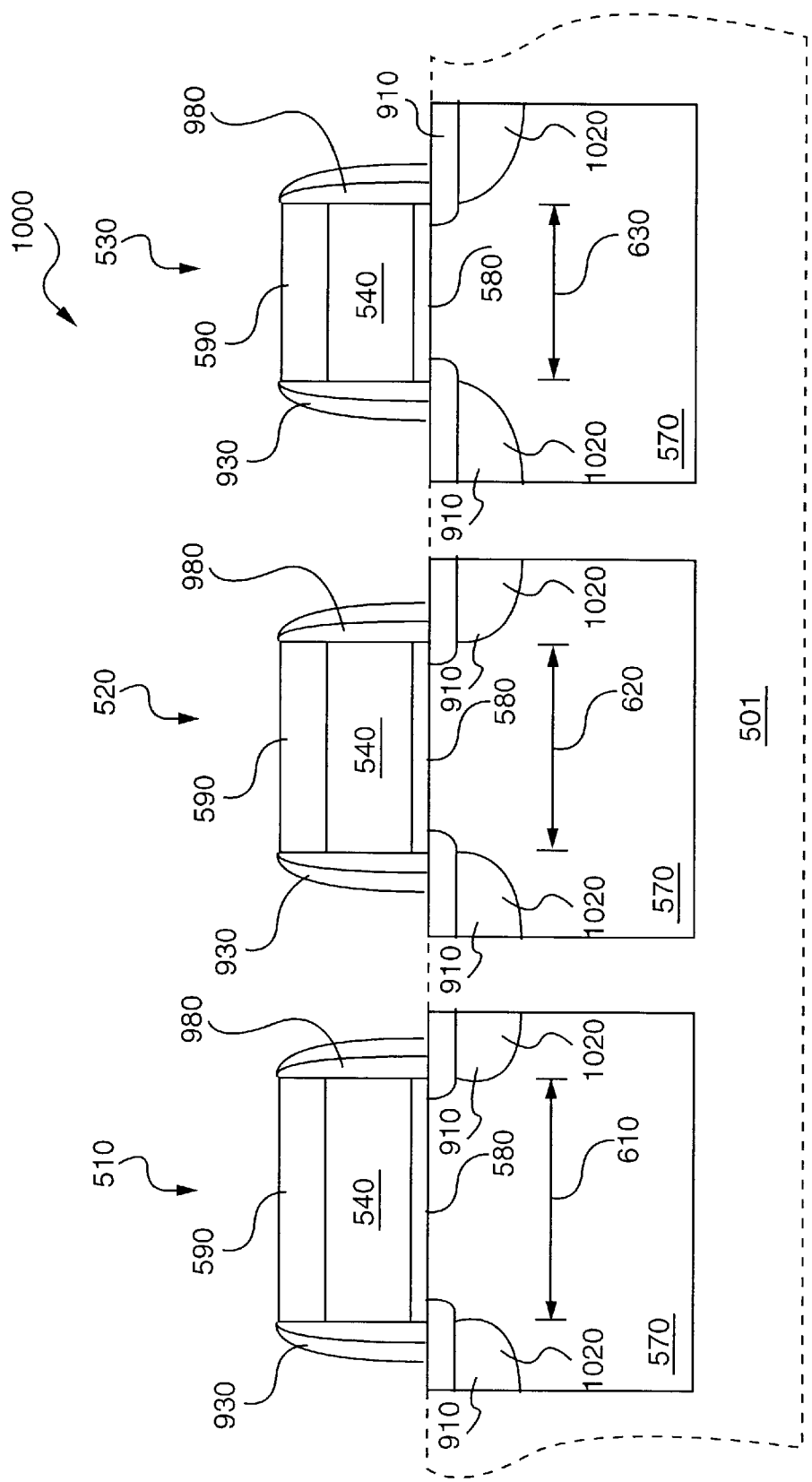

Turning now to FIG. 12, FIG. 12 illustrates a prior art method step after etching to create gates at locations 510, 520, and 530. Additionally, a thin spacer 980 (shown larger than its relative size for clarity) has been grown on the gate conductor stack, and extensions 910 have been doped. Finally, a layer 930 of spacer material has been deposited to an even thickness 920 across the semiconductor wafer 900. Turning now to FIG. 13, a prior art method step is shown after etching of spacer material 930 and doping of source/drain areas 1020. Because spacer material 930 was added to the same thickness at locations 510, 520, and 530, each gate is still has different widths 610, 620, and 630. The channel length for each gate and 510,520, and 530 is different because of the prior art's radial etching.

Figure 14:
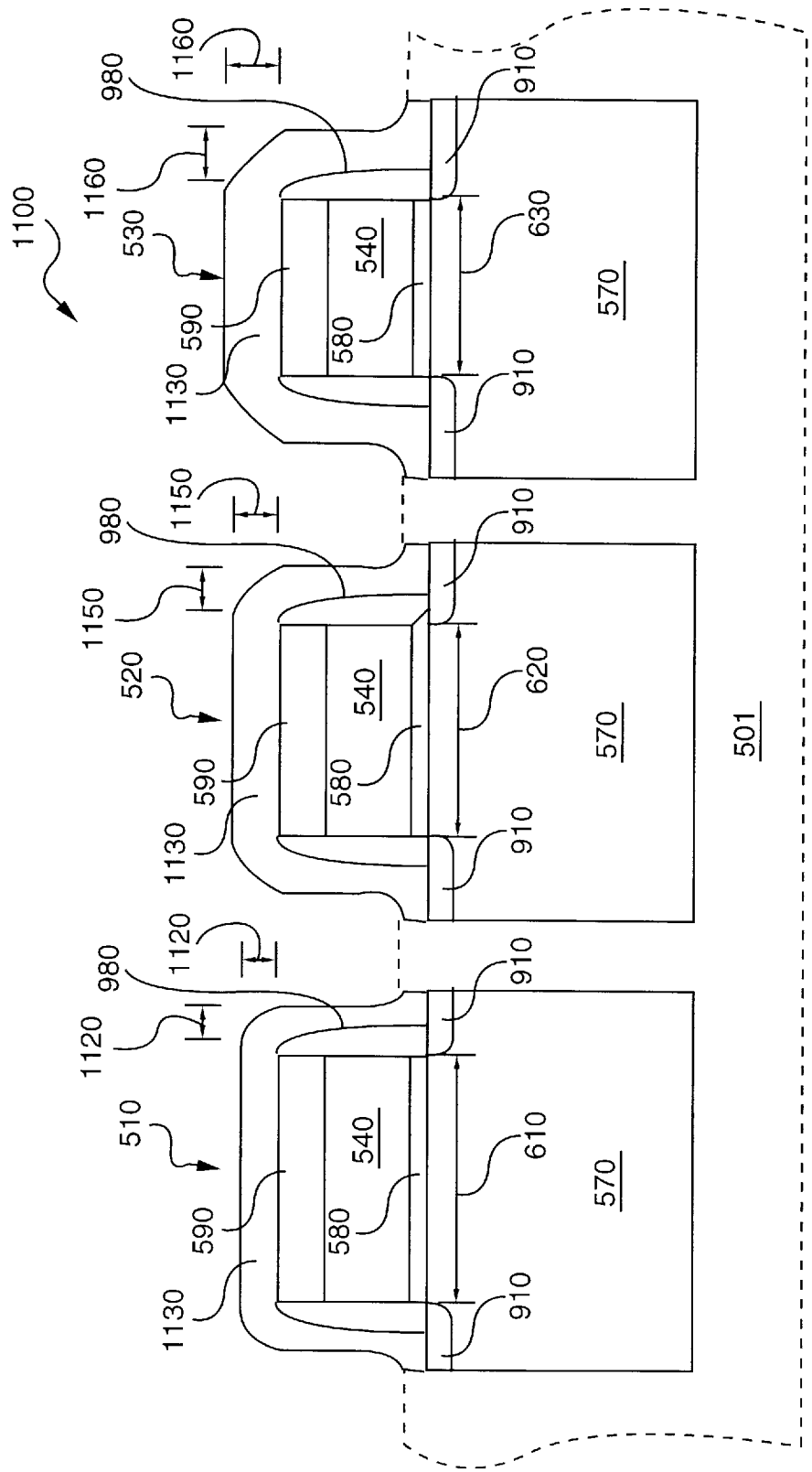
FIGS. 14 and 15 illustrate cross-sectional views of the semiconductor wafer during a preferred method, in accordance with a preferred embodiment of the present invention, wherein the thickness of the spacer material is changed to reduce the radial effects of etching.
Figure 15:
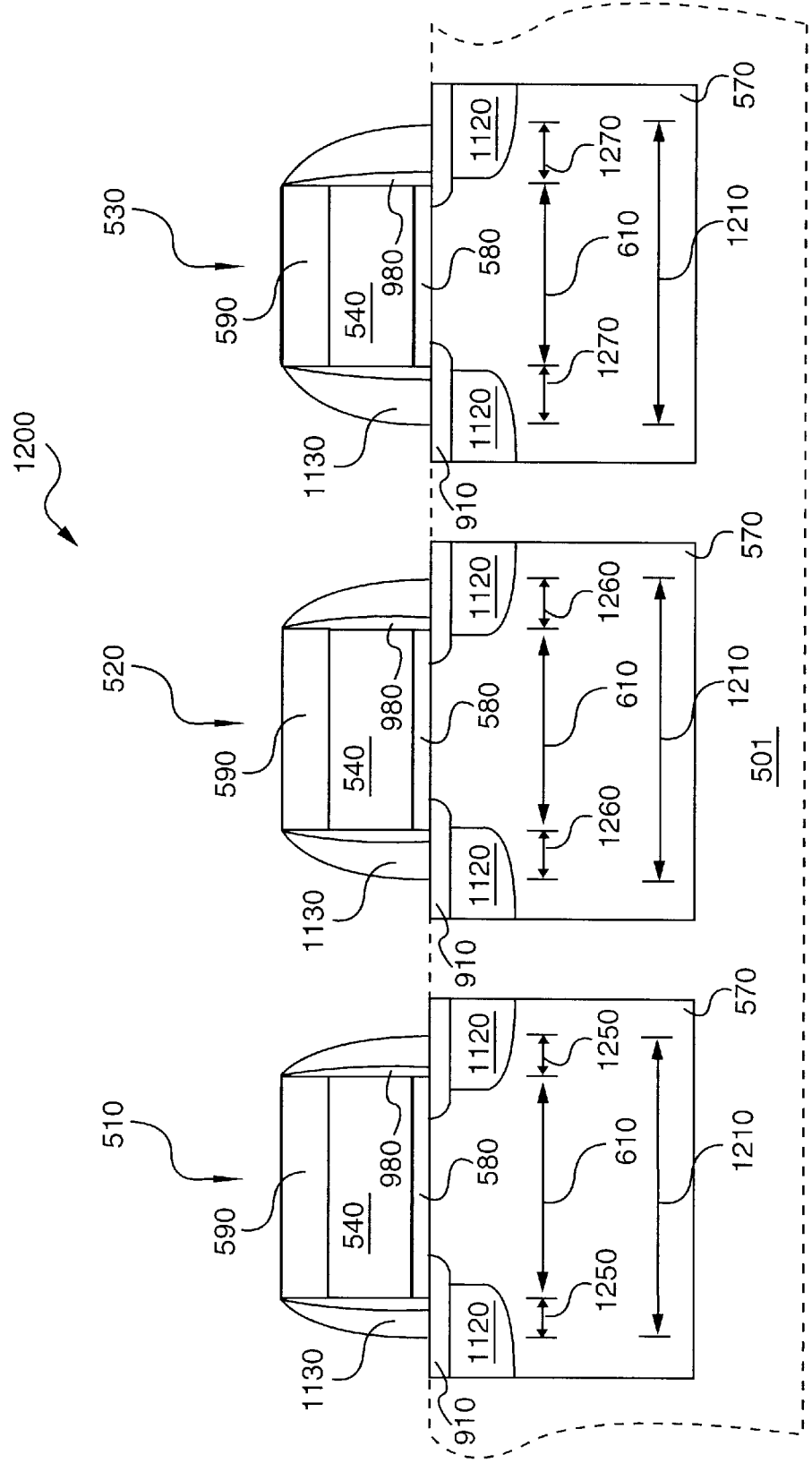

In the current invention, the semiconductor film may be added to different thicknesses at different radial locations on the semiconductor wafer. For example, turning to FIG. 14, semiconductor film 1130 (which will become spacers) is deposited to thickness 1120 at location 510, to a greater thickness 1150 at location 520, into an even greater thickness 1160 at location 530. Again, location 510 corresponds to location 402 of FIG. 6, while location 520 corresponds to location 405 of FIG. 6 and location 530 corresponds to location 409 of FIG. 6. Small sidewall spacers 980 (which are shown larger than their normal relative size) have been grown/deposited and extensions 910 have been doped. Turning now to FIG. 15, semiconductor wafer 1200 is shown after semiconductor film 1130 has been etched and source/drain locations 1020 have been doped.

As FIG. 15 illustrates, depositing less spacer film 1130 at location 510, more spacer film 1130 at location 520, and quite a bit more spacer film at location 530 should reduce the radial effects of etching by creating the same width 1210 gates. Even though the gate conductor stack will have different widths, caused by etching, at locations 610, 620, and 630, each gate will be the same width 1210 because of the varying spacer film thicknesses 1250, 1260, and 1270.

Figure 16:
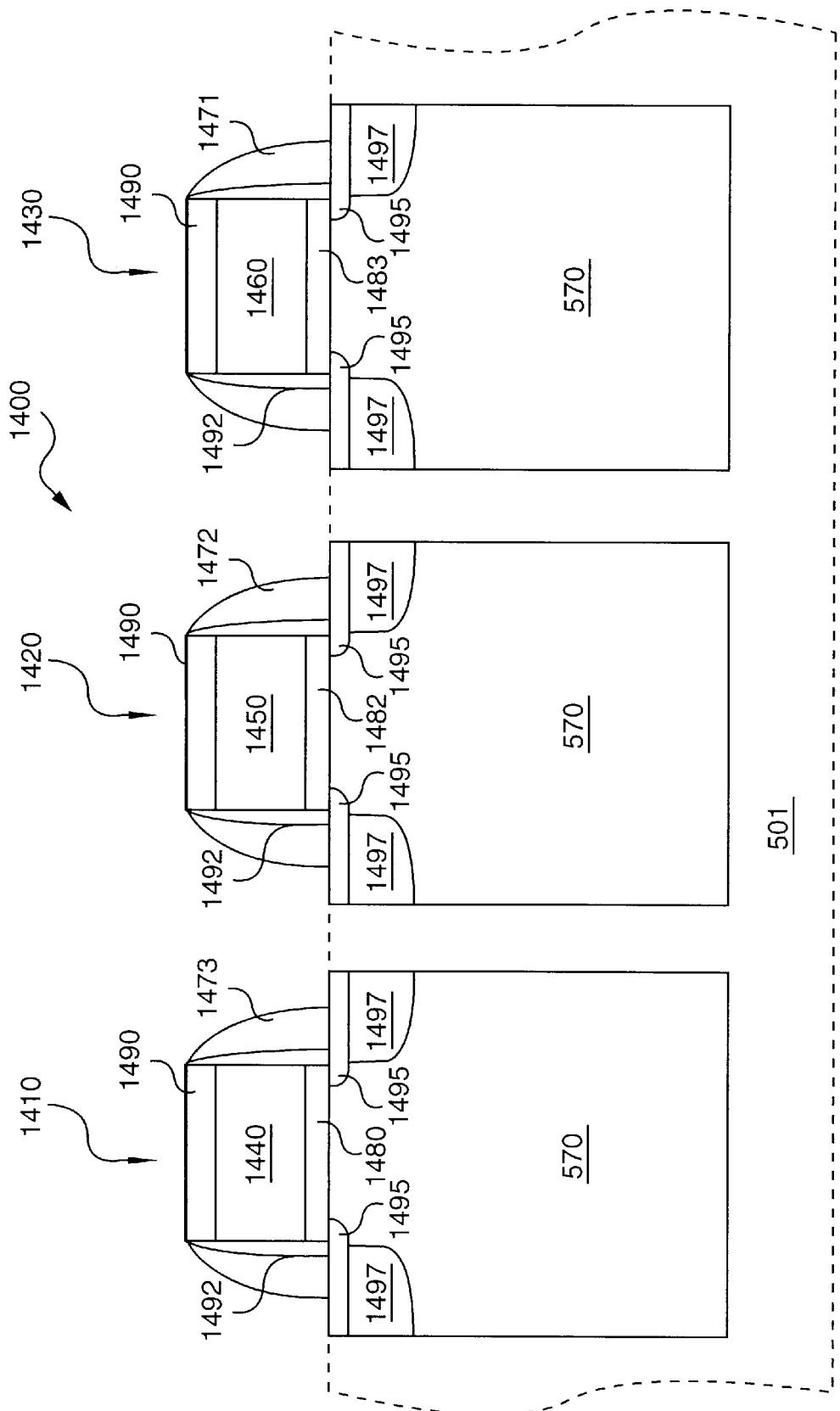
FIG. 16 illustrates cross-sectional views of a semiconductor wafer during a preferred method, in accordance with a preferred embodiment of the present invention, wherein the composition of gate conductor stack materials are changed to reduce the effects of uneven radial etching.

Referring now to FIG. 16, FIG. 16 shows semiconductor wafer 1400 with gates at locations 1410, 1420, and 1430. In this example, location 1410 corresponds to location 201 of FIG. 4, while location 1420 corresponds to location 207 of FIG. 4 in location 1430 corresponds to location 213 of FIG. 4. In this example, the versatility of using JVD tool (such as JVD tool 100 of FIG. 3) to determine optimal device characteristics is shown. The gates at locations 1410, 1420, and 1430 have gate dielectrics 1480, 1482, and 1483, gate conductors 1440, 1450, 1460, gate conductor caps 1490, thin gate spacers 1492, and larger gate spacers 1473, 1472, and 1471. Additionally, extensions 1495 and source/drain areas 1497 have been doped.

Although not shown on FIG. 16, the spacers 1471, 1472, 1473, and 1492 and the elements 1480, 1440, 1490 of the gate conductor stack may be deposited by a JVD tool in different thicknesses. By having a wide variety of compositions and thicknesses for gate conductors, gate spacers, and gate dielectrics, many devices with many different device characteristics may be created. One or more of these devices may meet or exceed the optimal device characteristics that have been predetermined and based on design criteria. To determine if the semiconductor device meets or exceeds the predetermined optimal characteristic, it is necessary to measure a device characteristic of many of the devices and compare each of the device's measured device characteristic versus the predetermined optimal device characteristic. FIG. 16 shows that many devices may be created on one semiconductor wafer. This uses less semiconductor wafers and many fewer processing steps than the normal method of creating small batches of test runs or exemplary chipsets, which are normally changed by using photolithography steps.

Figure 17:
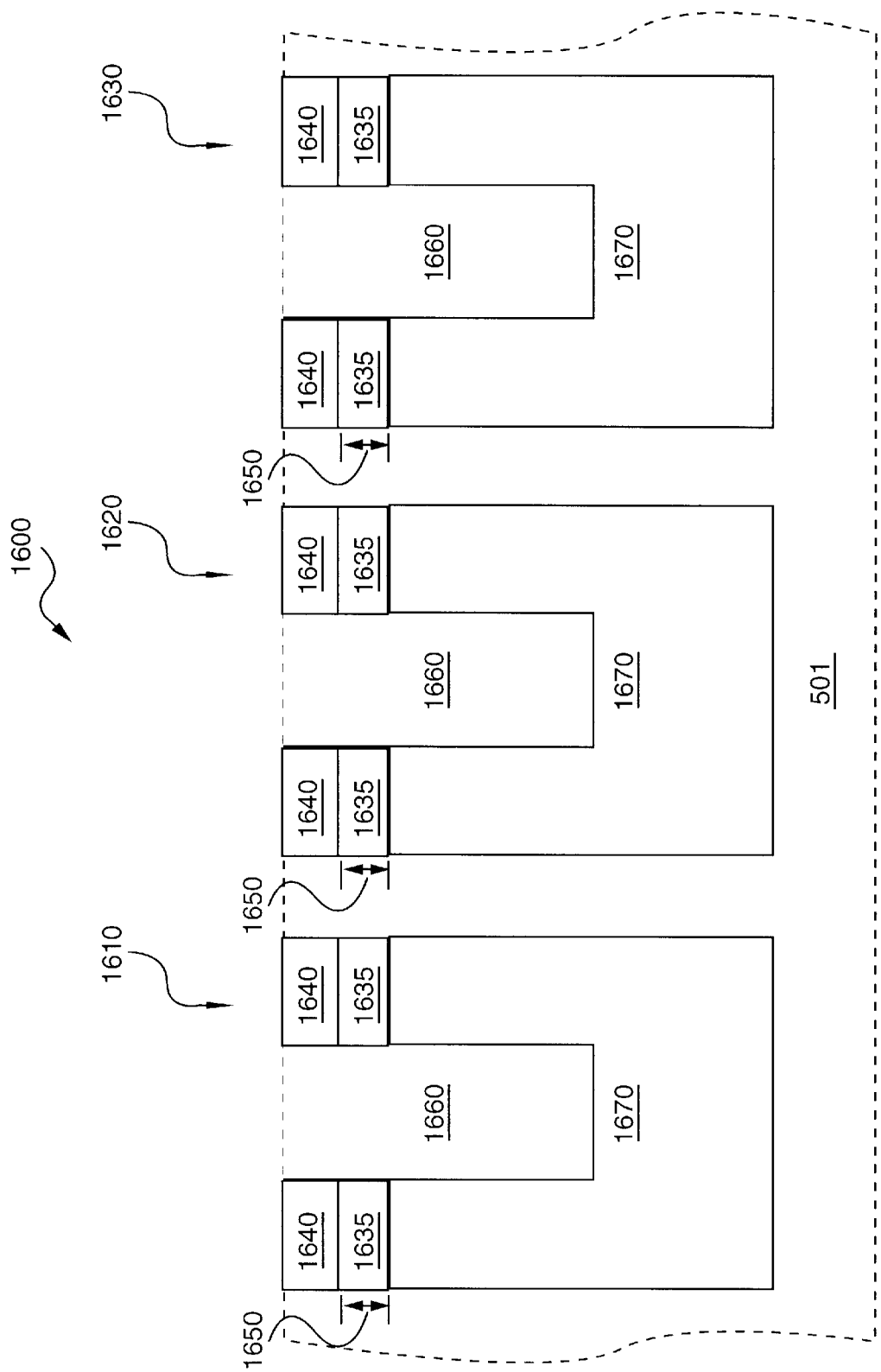
FIGS. 17 and 18 illustrate cross-sectional views of a semiconductor wafer during a prior art method of Chemical Mechanical Polishing (CMP)
Figure 18:
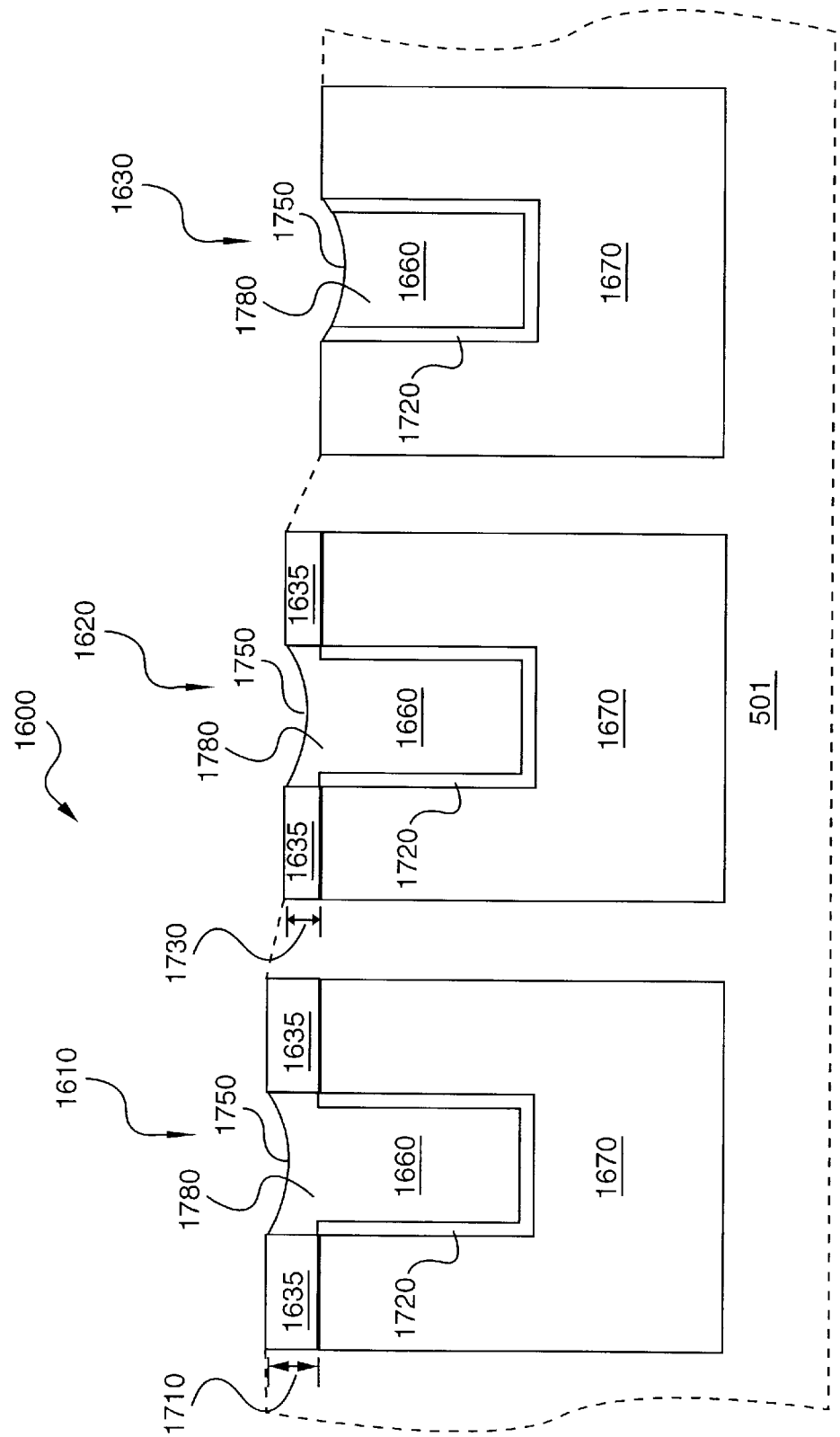

Turning now to FIG. 17, the 17 shows a prior art method wherein a CMP stop layer 1635 covers a substrate 1670 as part of a substrate 501. Semiconductor wafer 1600 further has photoresist layer 1640 that has been patterned to uncover Shallow Trench Isolation (STI) regions 1660. Location 1610 corresponds in this example to location 403 of FIG. 6, location 1620 corresponds to location 406 of FIG. 6 and location 1630 corresponds to location 409 of FIG. 6. An etchant has been used to create deep wells 1660 that will become STI regions. Referring now to FIG. 18, FIG. 18 shows the prior art method step after the semiconductor wafer 1600 has been subjected to several more processing steps. In particular, photoresist layer 1640 has been removed, and an oxide layer 1720 has been thermally grown in the STI regions 1660. Another oxide layer 1780 has been added over the entire surface of semiconductor wafer 1600. CMP has been performed, and this semiconductor processing step has created the radial variation shown in FIG. 18. In this example, it is known that CMP will polish areas near the outer circumference of the semiconductor wafer more than areas near the center of semiconductor wafer.

FIG. 18 illustrates this principle, because location 1610 still has CMP stop material 1635 at a thickness of 1710, while location 1620 has CMP stop material 1635 to a thickness 1730, and location 1630 has no CMP stop material. FIG. 18 also shows that STI material 1780 is "scooped" out of location 1660 because STI material 1780 is more easily removed than stop material 1635 or substrate 1720.

Figure 19:
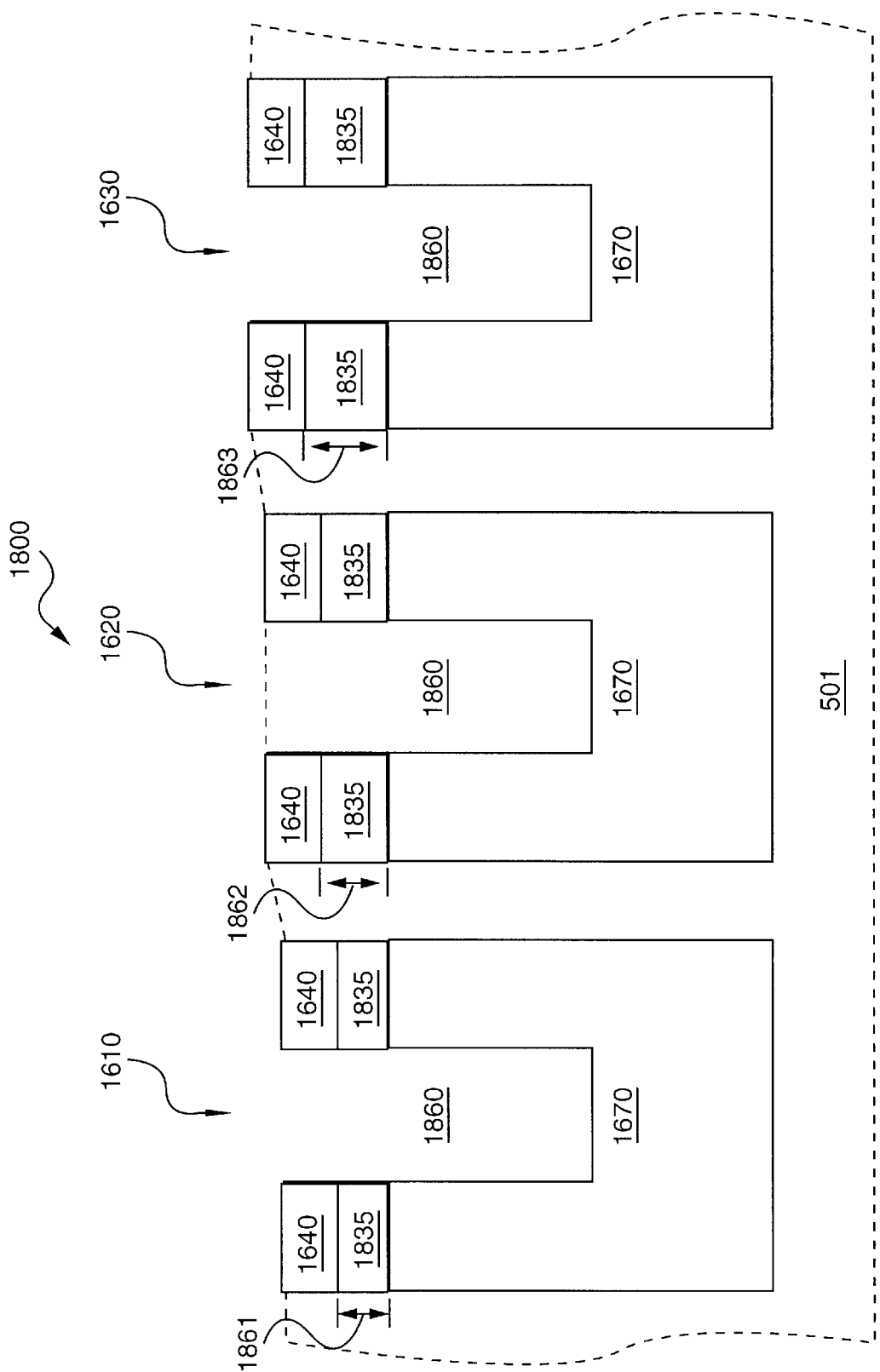
FIGS. 19 through 22 illustrate cross-sectional views of a semiconductor wafer during a preferred method, in accordance with a preferred embodiment of the present invention, that modifies thicknesses or compositions to reduce the radial effects of CMP.

There are several ways of attacking the problem illustrated by FIGS. 17 and 18. FIG. 19 illustrates one way of attacking this problem. In FIG. 19, CMP stop film 1835 is radially varied in thickness. Thickness 1861 is less than thickness 1862, which is itself less than thickness 1863. In this manner, the outer radii will have more CMP stop on them than will the inner radii. This should reduce the radial effects caused by CMP.

Figure 20:
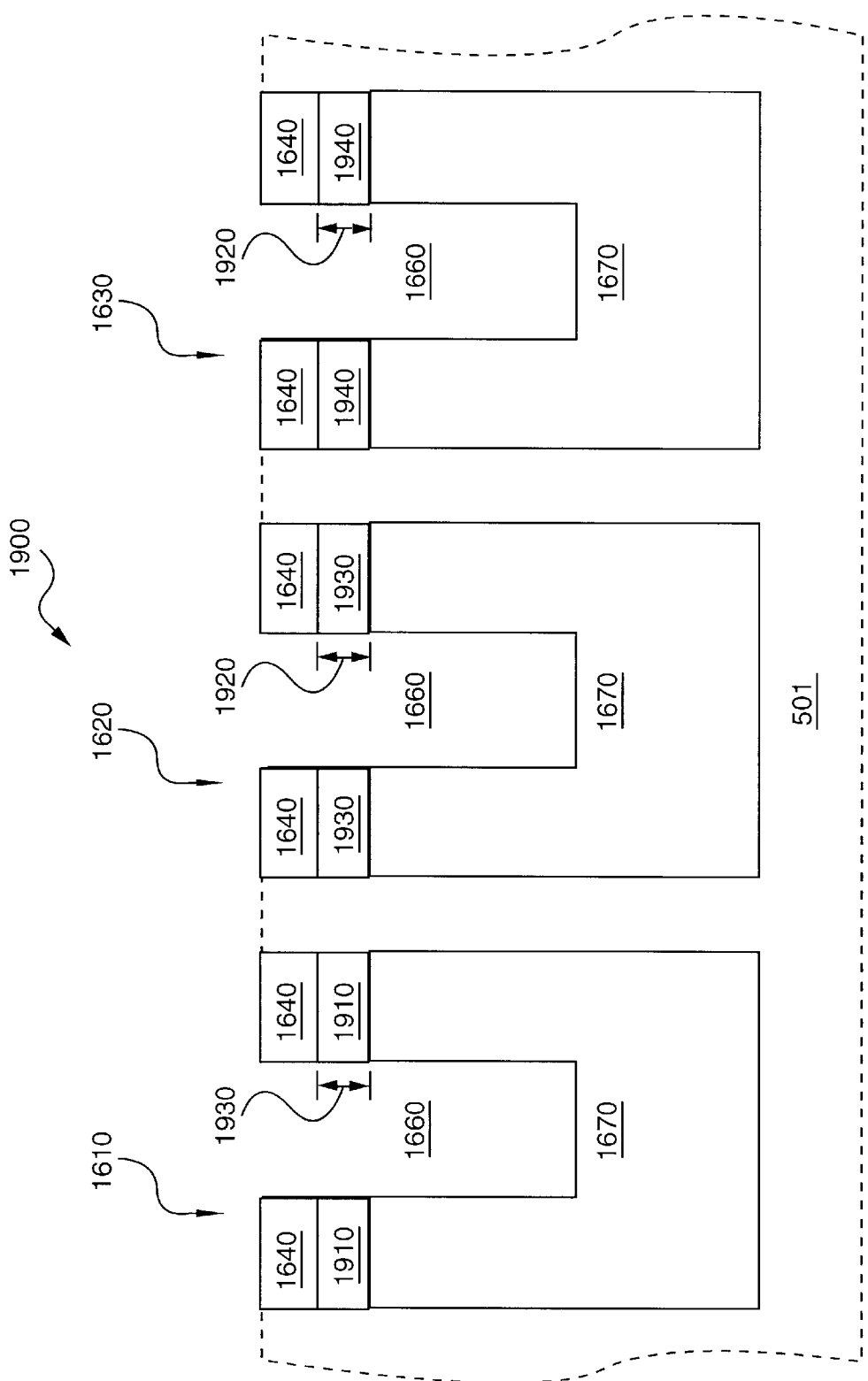

FIG. 20 shows in another way of attacking this problem. In FIG. 20, the composition of the CMP stop material is radially varied. For example, in location 1610, CMP stop material 1910 is used, while in location 1620 CMP stop material 1930 is used, and in location 1630 CMP stop material 1940 is used. For example, if silicon nitride is been used as a CMP stop, the percentage of silicon could be radially varied at locations 1610, 1620, and 1630. For some polish processes, especially those that rely on abrasion rather than primarily on chemical means, the higher the percentage of silicon, the faster the polishing rate, which means that more silicon would be added towards the center of the wafer than at the outer radii of the wafer. Alternatively, silicon oxide can be added to the silicon nitride in CMP stop materials. The higher silicon oxide content would provide a higher polish rate. The areas that polish faster (such as location 1630) could be coated with silicon nitride, and areas that polish slower (such as location 1610) could be coated with an appropriate mixture of silicon oxide and silicon nitride.

Figure 21:
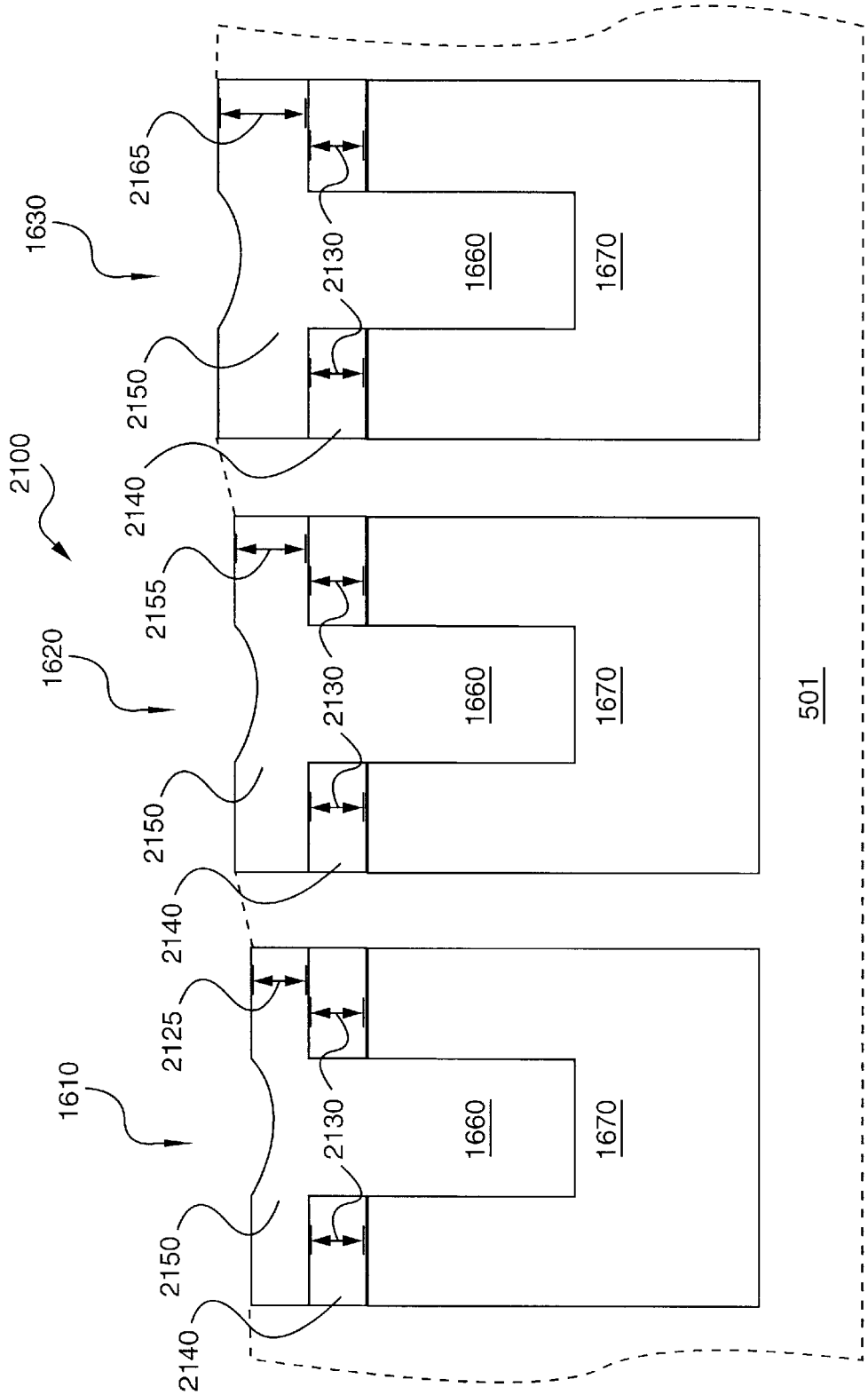

As a third method of attacking this problem, which is to have the CMP stop material be left the same thickness everywhere on the wafer after CMP, the silicon oxide fill could be increased in thickness with increasing radial distance from the center of the semiconductor wafer. FIG. 21 shows this embodiment. In FIG. 21, CMP stop material 2140 is the same thickness 2130 at all locations on the wafer. Silicon oxide fill 2150 is different thicknesses depending on the radial location. In this example, silicon oxide fill 2150 has thickness 2125 at location 1610 (where there is a slower polishing rate), a greater thickness 2155 at location 1620 (where there is a slightly higher polishing rate), an even greater thickness 2165 at location 1630 (which has the highest polishing rate).

Figure 22:
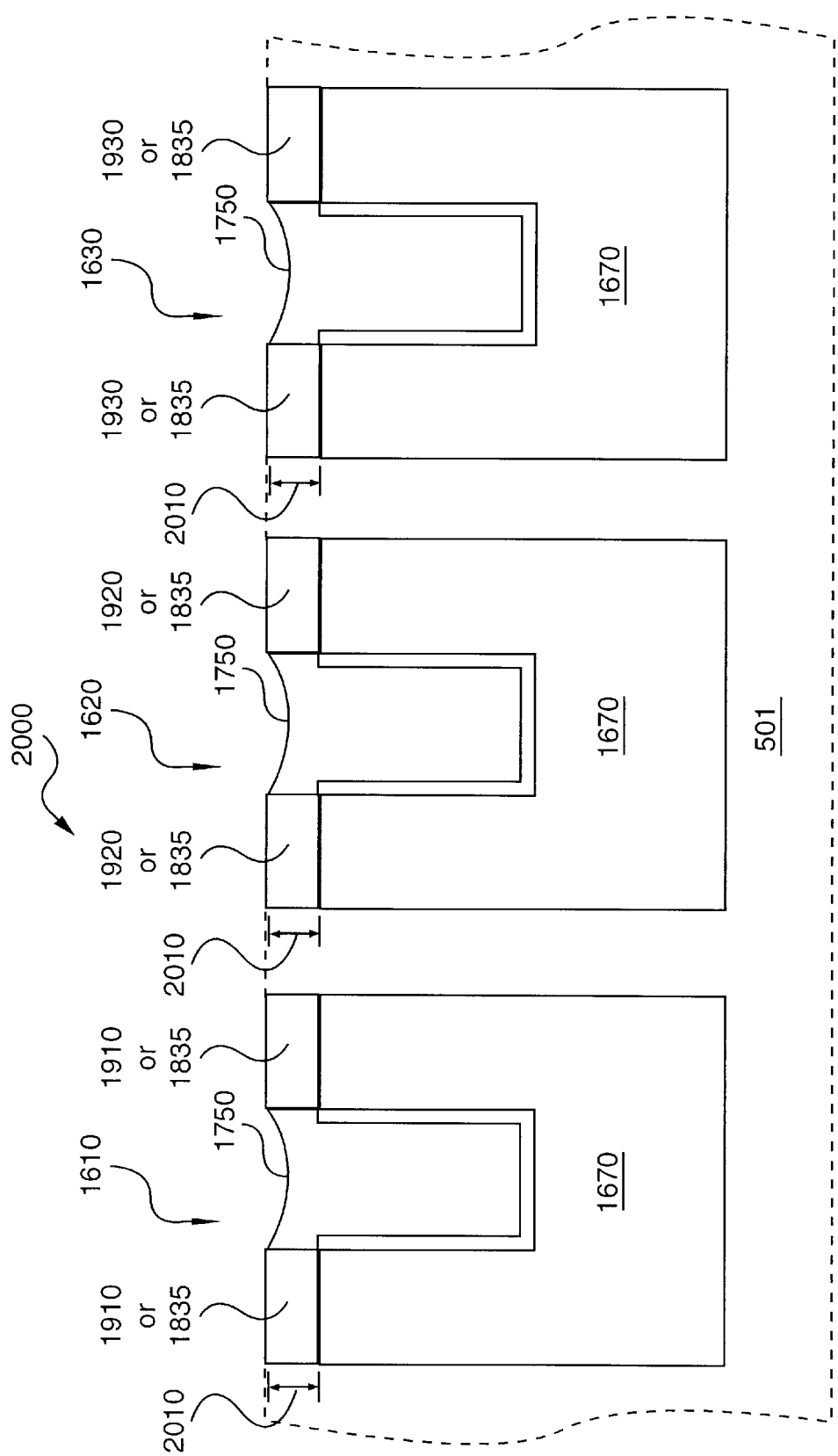

Each of the methods of attacking this problem, as shown in FIGS. 19, 20, and 21, should result in even polishing of the semiconductor wafer and, in particular, the CMP stop semiconductor film or silicon oxide fill. This is shown in FIG. 22, where the thicknesses 2010 of stop material 1910 or 1835 are all the same.

Thus, the preferred embodiments capitalize on the use of a JVD tool to compensate for radial processing effects caused by a radial processing step, to determine optimal device characteristics, or to produce a variety of devices for small volume production. Various changes in form and details may be made herein without departing from the spirit and scope of the invention. Moreover, an order to method claims is not to be implied, unless an order is necessary.

What is claimed is:

1. A method for compensating for radial processing effects on a semiconductor wafer, the method comprising the steps of:

depositing a semiconductor film to a first thickness at an inner radius of a semiconductor wafer;

depositing the semiconductor film to a second thickness at an outer radius of the second semiconductor wafer, wherein the first and second thicknesses are chosen to reduce a known radial variation in the semiconductor film that is caused by performing a semiconductor processing step on the semiconductor film; and performing the semiconductor processing step on the semiconductor film.

2. The method of claim 1 wherein the semiconductor film is a Chemical-Mechanical Polishing (CMP) stop material, the second thickness is larger than the first thickness, and the semiconductor processing step is a CMP step.

3. The method of claim 1 wherein the semiconductor film is a Shallow Trench Isolation (STI) fill material, the second thickness is larger than the first thickness, and the semiconductor processing step is a CMP step.

4. The method of claim 3 wherein the STI fill material is silicon oxide.

5. The method of claim 1 wherein the semiconductor film is a gate conductor material, the second thickness is larger than the first thickness, and the semiconductor processing step is an etch.

6. The method of claim 5 wherein the etch is a reactive ion etch.

7. The method of claim 6 wherein the gate conductor material is selected from the group consisting essentially of polysilicon, metal, tungsten, and tungsten silicide.

8. The method of claim 1 wherein the semiconductor film is a spacer material, the second thickness is larger than the first thickness, and the semiconductor processing step is an etch.

9. A method for compensating for radial processing effects on a semiconductor wafer, the method comprising the steps of:

depositing a layer of semiconductor film that at least partially covers a substrate of a semiconductor wafer, wherein the semiconductor film:

comprises a first composition at an inner radius of the semiconductor wafer, the first composition comprising at least two materials in a first predetermined proportion; and comprises a second composition at an outer radius of the semiconductor wafer, the second composition comprising at least two materials in a second predetermined proportion, and wherein the first and second compositions are chosen to reduce a known radial variation in the semiconductor film that is caused by performing a semiconductor processing step on the semiconductor film; and performing the semiconductor processing step on the semiconductor film.

10. The method of claim 9 wherein the first and second predetermined proportions are different.

11. The method of claim 10 wherein the at least two materials deposited at the inner radius are different than the at least two materials deposited at the outer radius.

12. The method of claim 9 wherein the at least two materials deposited at the inner radius are different than the at least two materials deposited at the outer radius.

13. The method of claim 9 wherein the semiconductor film is a Chemical-Mechanical Polishing (CMP) stop, the at least two materials for both the first and second compositions comprise silicon and oxygen wherein the first and second composition comprise silicon oxide, the first predetermined proportion has a higher silicon proportion than does the second predetermined proportion, and the semiconductor processing step is a CMP step.

14. The method of claim 9 wherein the semiconductor film is a Chemical-Mechanical Polishing (CMP) stop, the at least two compositions first and second compositions comprise silicon oxide and silicon nitride, the first predetermined proportion has a higher silicon oxide proportion than does the second predetermined proportion, and the semiconductor processing step is a CMP step.

* * * * *